United States Patent
Isono et al.

(10) Patent No.: US 10,411,169 B2
(45) Date of Patent: Sep. 10, 2019

(54) LIGHT EMITTING DEVICE HAVING LEADS IN RESIN PACKAGE

(71) Applicant: NICHIA CORPORATION, Anan-shi, Tokushima (JP)

(72) Inventors: Mitsuhiro Isono, Itano-gun (JP); Kensuke Maehara, Komatsushima (JP); Kazuya Matsuda, Anan (JP); Takaaki Kato, Takamatsu (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/886,726

(22) Filed: Feb. 1, 2018

(65) Prior Publication Data

US 2018/0226544 A1 Aug. 9, 2018

(30) Foreign Application Priority Data

Feb. 3, 2017 (JP) ................................. 2017-018884
Apr. 11, 2017 (JP) ................................. 2017-078178

(51) Int. Cl.
*H01L 33/48* (2010.01)
*H01L 33/54* (2010.01)
(Continued)

(52) U.S. Cl.
CPC .......... *H01L 33/486* (2013.01); *H01L 33/504* (2013.01); *H01L 33/54* (2013.01);
(Continued)

(58) Field of Classification Search
CPC ..... H01L 33/486; H01L 33/504; H01L 33/54; H01L 33/56; H01L 33/60; H01L 33/62; H01L 33/46; H01L 2224/48247; H01L 2224/49113; H01L 2933/0041; H01L 33/483; H01L 33/52
See application file for complete search history.

(56) References Cited

U.S. PATENT DOCUMENTS 9,318,675 B2 * 4/2016 Yoon ....................... H01L 33/52
2008/0054287 A1 3/2008 Oshio et al.
(Continued)

FOREIGN PATENT DOCUMENTS

JP 2005-136378 A 5/2005
JP 2008-060344 A 3/2008
(Continued)

*Primary Examiner* — Michael Jung
(74) *Attorney, Agent, or Firm* — Foley & Lardner LLP

(57) ABSTRACT

A light emitting device includes: a resin package including: a first lead including: at least one notch extending from an upper surface of the first lead to a lower surface of the first lead, a first groove formed in the upper surface of the first lead, and at least one second groove connecting the first groove with the at least one notch, and a second lead, and a resin body including: a first resin portion, a second resin portion, a part of the second resin portion being disposed in the first groove, a third resin portion disposed between the first lead and the second lead, and a first resin connecting portion connecting the first resin portion with the second resin portion, at least a part of the first resin connecting portion being disposed in the at least one second groove; a light emitting element; and a light reflecting member.

14 Claims, 22 Drawing Sheets

(51) Int. Cl.
*H01L 33/62* (2010.01)
*H01L 33/50* (2010.01)
*H01L 33/56* (2010.01)
*H01L 33/60* (2010.01)
*H01L 33/46* (2010.01)

(52) U.S. Cl.
CPC .............. *H01L 33/56* (2013.01); *H01L 33/60* (2013.01); *H01L 33/62* (2013.01); *H01L 33/46* (2013.01); H01L 2224/48247 (2013.01); H01L 2224/49113 (2013.01); H01L 2933/0033 (2013.01); H01L 2933/0041 (2013.01); H01L 2933/0058 (2013.01)

(56) References Cited

U.S. PATENT DOCUMENTS

| | | |
|---|---|---|
| 2011/0316027 A1 | 12/2011 | Liu et al. |
| 2013/0043502 A1 | 2/2013 | Koya et al. |
| 2013/0161665 A1 | 6/2013 | Kuwaharada et al. |
| 2013/0170208 A1 | 7/2013 | Kuwaharada et al. |
| 2013/0264604 A1* | 10/2013 | Hayashi ................. H01L 33/54 257/99 |
| 2014/0085884 A1 | 3/2014 | Horio et al. |
| 2014/0252401 A1* | 9/2014 | Nakabayashi .......... H01L 33/62 257/99 |
| 2014/0252582 A1 | 9/2014 | Nakabayashi et al. |
| 2015/0171282 A1* | 6/2015 | Wakaki ................. H01L 33/486 257/99 |

FOREIGN PATENT DOCUMENTS

| | | |
|---|---|---|
| JP | 2013-058739 A | 3/2013 |
| JP | 2013-115116 A | 6/2013 |
| JP | 2013-131519 A | 7/2013 |
| JP | 2014-067846 A | 4/2014 |
| JP | 2014-158011 A | 8/2014 |
| JP | 2014-175321 A | 9/2014 |
| JP | 2014-197674 A | 10/2014 |
| JP | 2015-153856 A | 8/2015 |
| JP | 2016-181653 A | 10/2016 |
| WO | WO-2011/136824 A1 | 11/2011 |
| WO | WO-2011/151998 A1 | 12/2011 |
| WO | WO-2012/049853 A1 | 4/2012 |
| WO | WO-2012/049854 A1 | 4/2012 |

* cited by examiner

101'

101

LIGHT EMITTING DEVICE HAVING LEADS IN RESIN PACKAGE

CROSS-REFERENCE TO RELATED APPLICATIONS

This application claims priority to Japanese Patent Application No. 2017-018884, filed on Feb. 3, 2017, and Japanese Patent Application No. 2017-78178, filed on Apr. 11, 2017, the disclosures of which are hereby incorporated by reference in their entireties.

BACKGROUND

The present disclosure relates to a light emitting device. A light emitting device described in, for example, Japanese Patent Publication No. 2014-158011 includes a resin package, which includes a lead and a resin portion, a reflection layer disposed on the inner walls of a recess of the resin package, and a light emitting element disposed at the bottom of the recess.

SUMMARY

In the light emitting device disclosed in Japanese Patent Publication No. 2014-158011, a resin frame is disposed around the light emitting element to prevent the reflection layer from covering the lateral surfaces of the light emitting element. In such a light emitting device, for example, when the resin portion, which is included in the resin package, and the resin frame are integrally molded by a molding method, a part of a region that is to be the resin frame may not be sufficiently filled with a resin material, which may lead to lack of a portion of the resin frame. Embodiments according to the present disclosure provides a highly-reliable light emitting device in which lack of a portion of the resin frame is prevented.

A light emitting device of the present disclosure includes: includes: a resin package, a light emitting element, and a light reflective member. The resin package includes a plurality of leads and a resin body. The plurality of leads includes a first lead and a second lead. The first lead includes a notch extending from an upper surface of the first lead to a lower surface of the first lead, a first groove formed in the upper surface of the first lead in at least a part of a region surrounding an element mounting region, and a second groove connecting the first groove with the notch. The resin body includes a first resin portion forming an outer lateral surface of the resin package, a second resin portion surrounding an element mounting region, a part of the second resin portion disposed in the first groove, a third resin portion disposed between the first lead and the second lead, and a first resin connecting portion connecting the first resin portion with the second resin portion, at least a part of the first resin connecting portion disposed in the second groove. The plurality of leads and an inner wall surface of the first resin portion form a recess. A part of an upper surface of the first lead, a part of an upper surface of the second lead, and a part of an upper surface of the third resin portion are disposed at a bottom surface of the recess. The notch is disposed in the first resin portion. The light emitting element disposed on the element mounting region. The light reflecting member disposed in the recess at a portion between the inner wall surface and the second resin portion.

According to a light emitting device of the present disclosure, a highly-reliable light emitting device can be realized.

DETAILED DESCRIPTION

Figure 1A:
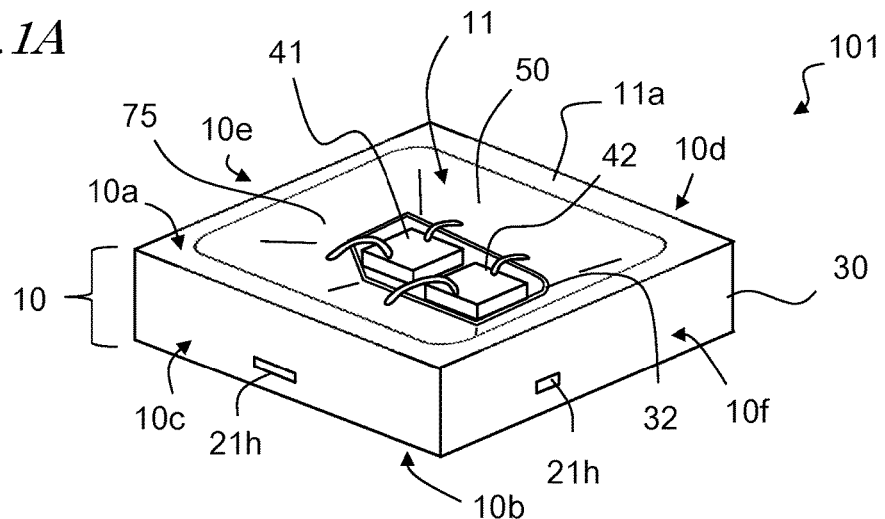
FIG. 1A is a schematic perspective view of a light emitting device of the first embodiment when viewed from a top surface side.

There are light emitting devices that include a reflection layer having a light reflecting surface near a light emitting element in order to efficiently extract light emitted from the light emitting element. In some such light emitting devices, in order that an uncured resin material, which is to be the reflection layer, would not cover lateral surfaces of the light emitting element, a wall for damming the resin material is disposed surrounding the light emitting element.

In such a light emitting device, simultaneously forming the wall surrounding the light emitting element and a resin body, which is included in the resin package, is advantageous in terms of cost. For example, when the resin package is formed by molding, connecting a hollow of the mold for formation of the resin body with a hollow of the mold for formation of the wall surrounding the light emitting element enables integral and simultaneous formation of the resin body and the wall. However, a part of the wall surrounding the light emitting element, e.g., a part of the wall which is distant from the resin inlet, may not be sufficiently filled with a resin material, which may lead to lack of a part of the wall. The light emitting device according to the present disclosure has been made I view of such circumstances, and one object of the light emitting device of the present disclosure is to solve the above-described problem.

Hereinafter, embodiments of a light emitting device will be described in detail with reference to the drawings. The light emitting devices described in the present disclosure are examples, and the present invention is not limited to the light emitting devices described below. In the following description, terms that designate directions or positions (e.g., "upper", "lower", and other terms including such terms) will be used. Such terms are used for ease of understanding, and are to be construed as relative directions or positions in the referred drawings, rather than absolute directions or positions. The sizes or positional relationships of members shown in the drawings may be exaggerated for ease of understanding. The sizes of members in the light emitting device, or the relative sizes of the members in the light emitting device, may not be reflected in the drawings.

First Embodiment

Light Emitting Device 101

Figure 1B:
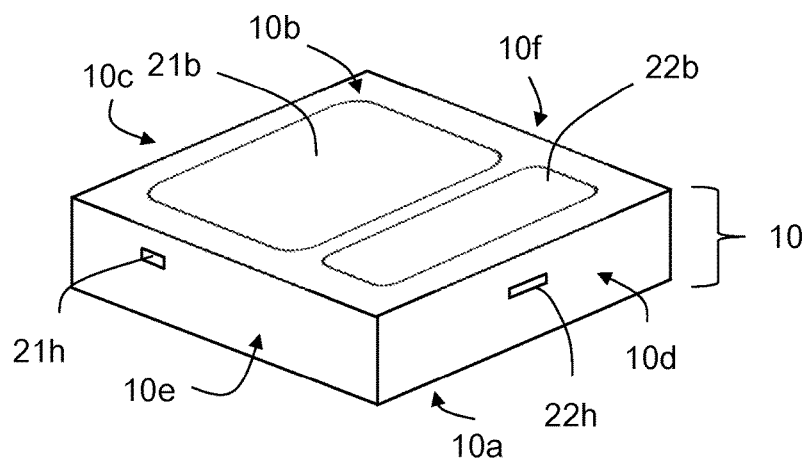
FIG. 1B is a schematic perspective view of the light emitting device of the first embodiment when viewed from a bottom surface side.
Figure 1C:
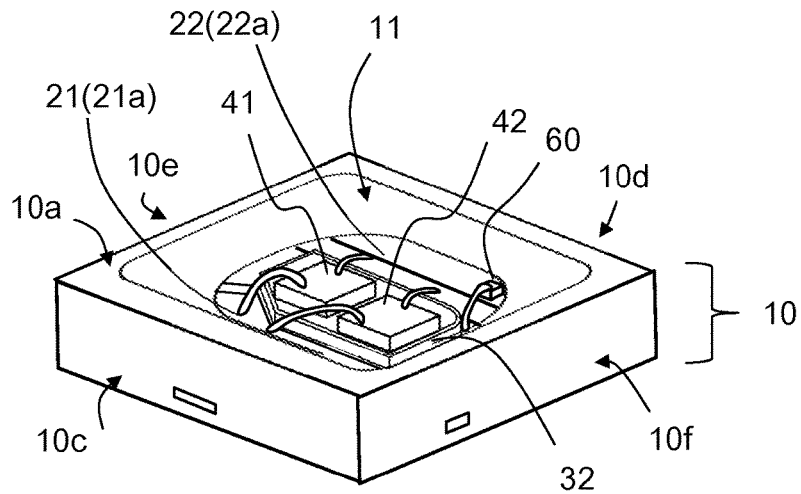
FIG. 1C is a schematic perspective view of the light emitting device of the first embodiment from which a light reflecting member is not shown, when viewed from a top surface side.
Figure 2A:
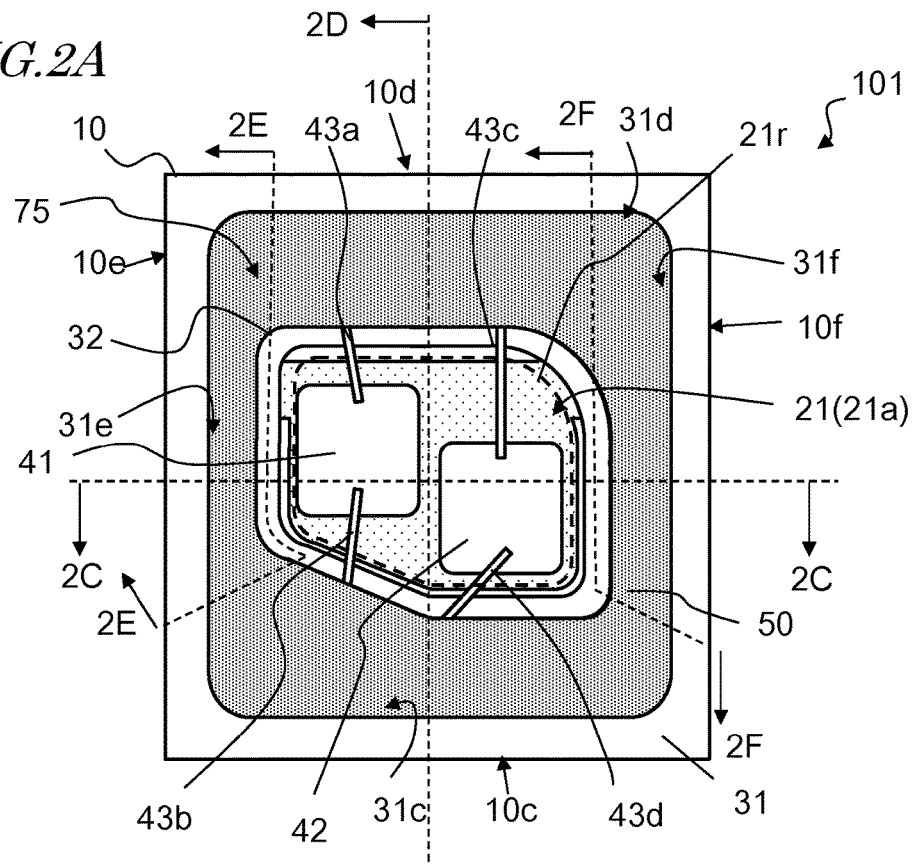
FIG. 2A is a schematic top view of the light emitting device of the first embodiment.
Figure 2B:
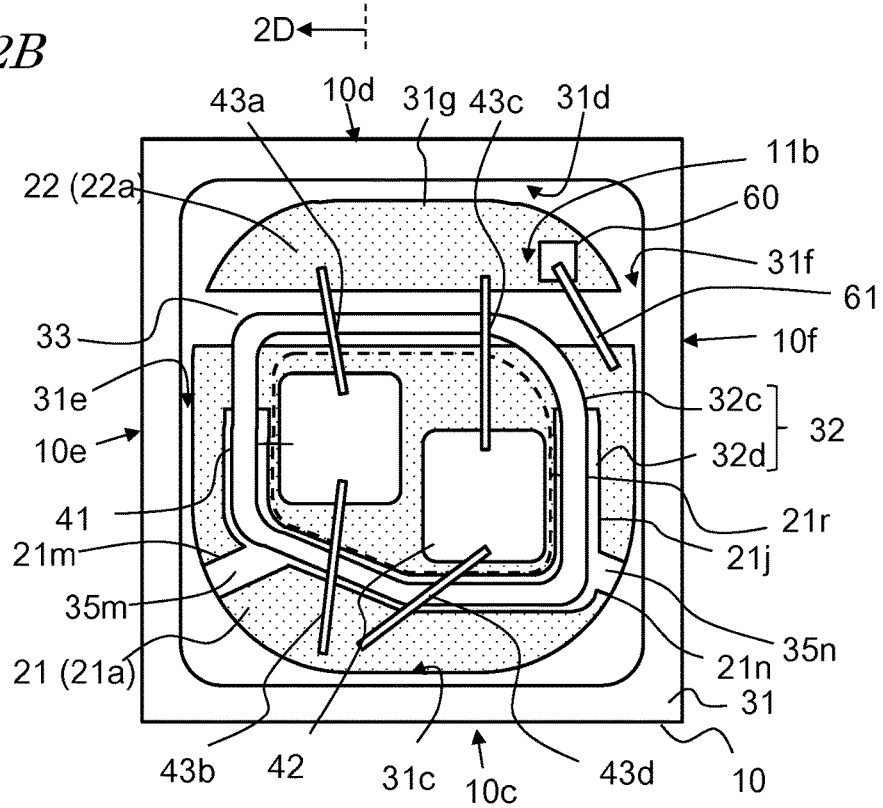
FIG. 2B is a schematic top view of the light emitting device of the first embodiment in which a light reflecting member is not shown.

A light emitting device 101 will be described according to a first embodiment of the present disclosure. FIG. 1A and FIG. 1B are schematic perspective views of the light emitting device 101, viewed from the top surface side and the bottom surface side, respectively. FIG. 1C is a schematic perspective view of the light emitting device 101 viewed from the top surface side, in which a sealing member 75 and a light reflecting member 50 are not shown. FIG. 2A is a schematic top view of the light emitting device 101. FIG. 2B is a schematic top view of the light emitting device 101 fin which the sealing member 75 and the light reflecting member 50 are not shown. FIG. 2C, FIG. 2D, FIG. 2E and FIG. 2F are schematic cross-sectional views of the light emitting device 101 taken along a line 2C-2C, a line 2D-2D, a line 2E-2E and a line 2F-2F, respectively, of FIG. 2A. To show the internal structure, the sealing member 75 is shown as a transparent member in FIG. 1A and FIG. 2A.

The light emitting device 101 includes a resin package 10, one or more light emitting element, and a light reflecting member 50. In the present embodiment, the light emitting device 101 includes a light emitting element 41 and a light emitting element 42. The light emitting device 101 may include a sealing member 75. Hereinafter, respective members are described in detail.

Resin Package 10

The resin package 10 is a housing and defines a recess 11. At the inside of the recess 11, the light emitting elements 41, 42 and the light reflecting member 50 are arranged. The resin package 10 includes a resin body 30 and a plurality of leads including a first lead 21 and a second lead 22. The resin body 30 is integrally molded with the first lead 21 and the second lead 22. The first lead 21 has an upper surface 21a, and a lower surface 21b that is opposite to the upper surface 21a. The second lead 22 has an upper surface 22a, and a lower surface 22b that is opposite to the upper surface 22a. The first lead 21 and the second lead 22 are arranged such that the lower surface 21*b* and the lower surface 22*b* are substantially in the same plane. A third resin portion 33 of the resin body 30, which will be described below, is disposed between the first lead 21 and the second lead 22.

The resin package 10 has an upper surface 10*a*, and a lower surface 10*b* that is opposite to the upper surface 10*a*. In the present embodiment, the resin package 10 has a substantially quadrangular shape in a plan view. Thus, the resin package 10 has four outer lateral surfaces: an outer lateral surface 10*c*, an outer lateral surface 10*d* which is opposite to the outer lateral surface 10*c*, an outer lateral surface 10*e*, and an outer lateral surface 10*f* which is opposite to the outer lateral surface 10*e*. The external shape of the resin package 10 in a plan view is not limited to quadrangular but may be any other appropriate shape. In a plan view, the resin package 10 may have an anode or cathode mark formed by chamfering one of the corners of an opening 11*a*. The anode or cathode mark functions as a mark which designates the polarity of each of two leads.

The resin package 10 has a recess 11 which has an opening 11*a* in the upper surface 10*a*. At the bottom surface of the recess 11, a part of the upper surface 21*a* of the first lead 21 and a part of the upper surface 22*a* of the second lead 22 are provided. The shape of the recess 11 will be described in detail in the description of the resin body 30.

At the lower surface 10*b* of the resin package 10, the lower surface 21*b* of the first lead 21 and the lower surface 22*b* of the second lead 22 are exposed.

First Lead 21, Second Lead 22

The first lead 21 and the second lead 22 are electrically conductive and serve as electrodes for supplying electricity to the light emitting elements 41, 42 and as heat-dissipating members which have high heat conductivity. In the present embodiment, the plurality of leads include the first lead 21 and the second lead 22, which serve as electrodes. The light emitting device 101 may further include a third lead in addition to the first lead 21 and the second lead 22. In the case where the plurality of leads include the first lead 21, the second lead 22 and the third lead, the first lead 21 is located between the second lead 22 and the third lead. In this case, the first lead 21 may serve as a heat-dissipating member, while the second lead 22 and the third lead may serve as electrodes.

Figure 3A:
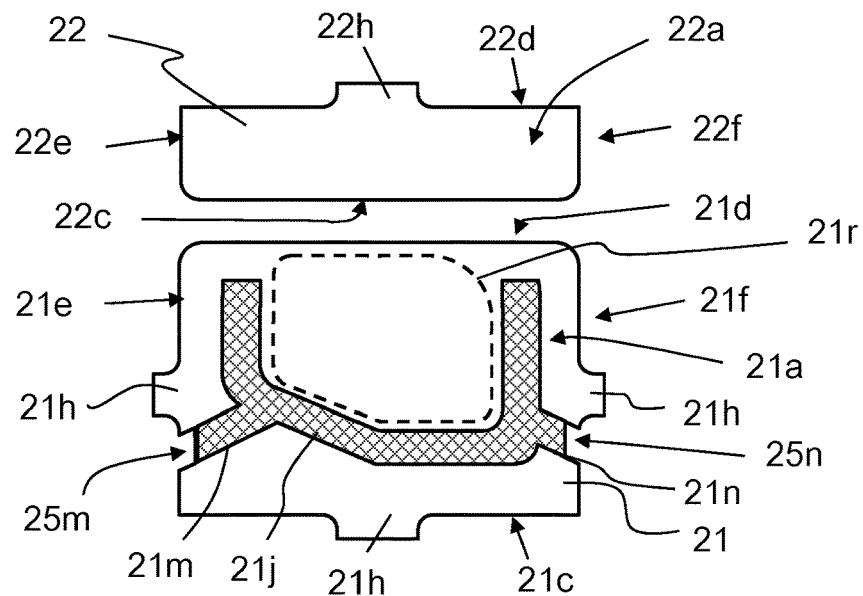
FIG. 3A is a schematic top view of the first lead and the second lead of the light emitting device of the first embodiment.
Figure 3B:
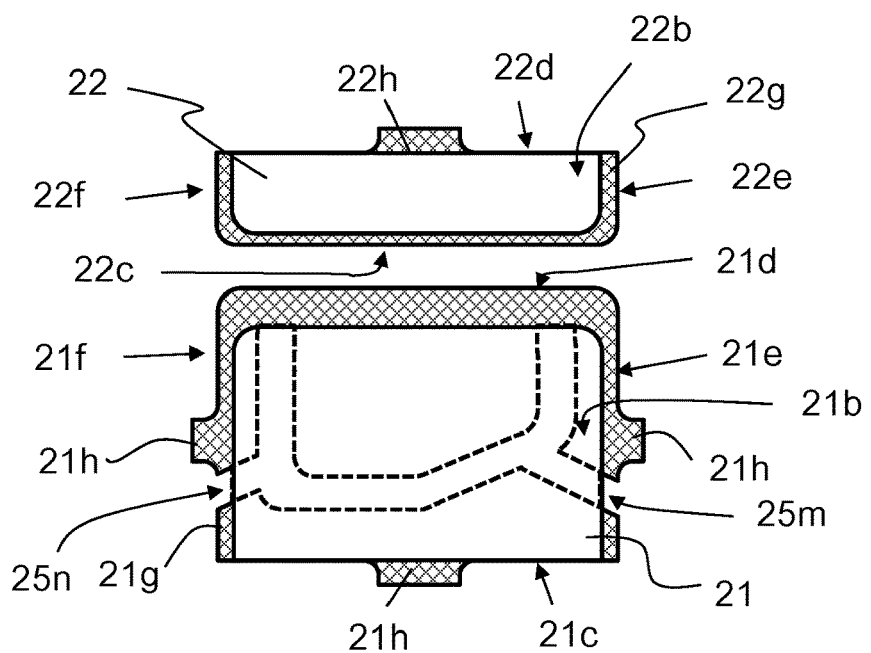
FIG. 3B is a schematic bottom view of the first lead and the second lead of the light emitting device of the first embodiment.

FIG. 3A and FIG. 3B are a schematic top view and a schematic bottom view, respectively, of the first lead 21 and the second lead 22. The first lead 21 has, for example, an approximately rectangular shape and has lateral portions 21*c*, 21*d*, 21*e*, 21*f*. The lateral portion 21*d* faces the second lead 22. The lateral portion 21*c* is opposite to the lateral portion 21*d*. The lateral portion 21*e* and the lateral portion 21*f* are opposite to each other and do not face the second lead 22.

The first lead 21 has a lateral edge groove 21*g* (indicated by hatching in FIG. 3B) extending along the lateral portions 21*d*, 21*e*, 21*f*, on the lower surface 21*b* side of the lateral portions 21*d*, 21*e*, 21*f*. The lateral edge groove 21*g* is extends from the lower surface 21*b* toward the upper surface 21*a* side. The lateral edge groove 21*g* can be formed by etching or pressing.

In a plan view, an extended portion 21*h* is provided near the center of each of the lateral portions 21*c*, 21*e*, 21*f*. The extended portions 21*h* are parts of the first lead 21. An end surface of the extended portion 21*h* at each of the lateral portions 21*c*, 21*e*, 21*f* is exposed from the resin body 30 at the outer lateral surface 10*c*, 10*e*, 10*f* of the resin package 10 as shown in FIG. 1A and FIG. 1B. In FIG. 1A and FIG. 1B, at each of the outer lateral surfaces 10*c*, 10*e*, 10*f* of the resin package 10, the end surface of the extended portion 21*h* is substantially in the same plane with the resin body 30. Each of the extended portions 21*h* is extended from the main part of the first lead 21 toward a respective one of the outer lateral surfaces 10*c*, 10*e*, 10*f* of the resin package 10. In FIG. 3A and FIG. 3B, the "main part" refers to a part of the first lead 21 other than the extended portion 21*h*, and has a substantially quadrangular external shape in a plan view.

The lateral portions 21*e*, 21*f* have notches 25*m*, 25*n*, respectively. The notch 25*m*, 25*n* is a hollow (i.e., hole) extending through the first lead 21 from the upper surface 21*a* to the lower surface 21*b*, and has an opening (i.e., slit) at an outer periphery of the lateral portion 21*e* or the lateral portion 21*f*. The notches 25*m*, 25*n* can be also referred to as recesses formed in the lateral portions 21*e*, 21*f*, respectively. The notches 25*m*, 25*n* do not need to be formed by cutting away parts of the lateral portions 21*e*, 21*f*. For example, the lateral portions 21*e*, 21*f* and the notches 25*m*, 25*n* may be integrally formed by processing using etching or pressing.

The notches 25*m*, 25*n* may be formed at any position in the lateral portions 21*e*, 21*f*. The notches 25*m*, 25*n* may be provided between the extended portion 21*h* and the lateral portion 21*d*, or between the extended portion 21*h* and the lateral portion 21*c*. In the present embodiment, the notches 25*m*, 25*n* are provided between the extended portion 21*h* and the lateral portion 21*c*, in the lateral portions 21*e*, 21*f*, respectively. When the lateral edge groove 21*g* is formed in the first lead 21, it is preferable that an entirety of each of the notches 25*m*, 25*n* is disposed at the lateral edge groove 21*g*. However, a portion of each of the notches 25*m*, 25*n* may be disposed inward toward the center side of the first lead 21 from the lateral edge groove 21*g*. Alternatively, the notches 25*m*, 25*n* may be in a region other than the lateral edge groove 21*g* of the first lead 21.

As will be described below, the notches 25*m*, 25*n* and the lateral edge groove 21*g* are filled with a part of the resin body 30. This arrangement allows for improving the adhesion between the resin body 30 and the plurality of leads. With the lateral edge groove 21*g* of the first lead 21 buried in a first resin portion 31, in the case where the notches 25*m*, 25*n* are entirely disposed at the lateral edge groove 21*g*, neither the notches 25*m*, 25*n* nor a part of the resin body 30 which fills the notches 25*m*, 25*n* is disposed at the lower surface 21*b* of the first lead 21, which is exposed from the resin body 30 at the lower surface 10*b* of the resin package 10. Therefore, decrease in the area of the lower surface 21*b* of the first lead 21 exposed from the resin body 30 due to the resin body 30 that fills the notches 25*m*, 25*n* can be avoided. Thus, the heat generated from the light emitting elements 41, 42 can be efficiently radiated from the lower surface 21*b* of the first lead 21. When the light emitting device is incorporated into an applied product, due to various factors, the light emitting device may be modified while the wiring board on the applied product side is not modified. In such a case, with the notches 25*m*, 25*n* that are entirely disposed at the lateral edge groove 21*g* in the light emitting device 101, the plurality of leads can have the same shape as that of the lower surface of the leads of the light emitting device before modification. For example, when the shape of the lower surface of the first lead 21 of the light emitting device before modification has a substantially quadrangular shape as shown in FIG. 1B, the notches 25*m*, 25*n* that are entirely provided in the lateral edge groove 21*g* in the light emitting device 101 allows the shape of the lower surface 21*b* of the first lead 21 to be substantially the same with the shape of the light emitting device before modification. Thus, it can be used as a replacement for the light emitting device before modification.

The upper surface 21a of the first lead 21 has a first groove 21j and second grooves 21m, 21n. The first groove 21j is formed in at least a part of a region surrounding an element mounting region 21r of the upper surface 21a represented by a broken line. The "element mounting region 21r" refers to a region in which the light emitting elements 41, 42 are to be mounted. The expression "the first groove 21j is formed in at least a part of a region surrounding the element mounting region 21r" refers to both of a case where the first groove 21j is formed in the entire region (i.e., entire perimeter) surrounding the element mounting region 21r and a case where the first groove 21j is formed in at least a part of a region surrounding the element mounting region 21r. The first groove 21j is filled with a part of a second resin portion 32 of the resin body 30 which will be described later.

The first groove 21j and the second grooves 21m, 21n are preferably arranged so as not to overlap the lateral edge groove 21g provided in the lateral portion 21d. If the first groove 21j formed in the upper surface 21a overlaps the lateral edge groove 21g at the lower surface 21b side, the thickness of the lead 21 in that portion is reduced from the upper surface 21a side and from the lower surface 21b side, and therefore, the strength of the lead 21 may not be sufficiently secured. That is, arranging the first groove 21j so as not to overlap the lateral edge groove 21g provided in the lateral portion 21d allows for securing sufficient strength of the lead 21.

The second groove 21m connects the notch 25m with the first groove 21j. Likewise, the second groove 21n connects the notch 25n with the first groove 21j. As will be described below, the first resin connecting portions 35m, 35n of the resin body 30 are formed in the second grooves 21m, 21n.

Likewise, the second lead 22 has, for example, a substantially rectangular shape and includes lateral portions 22c, 22d, 22e, 22f. The second lead 22 has a lateral edge groove 22g (indicated by hatching in FIG. 3B) along the lateral portions 22c, 22e, 22f of the lower surface 22b. In a plan view, an extended portion 22h is disposed near the center of the lateral portion 22d. The extended portion 22h is a part of the second lead 22. An end surface of the extended portion 22h at the lateral portion 22d is exposed at an outer lateral surface 10d of the resin package 10. The extended portion 22h is extended from a main part of the second lead 22 toward the outer lateral surface 10d of the resin package 10. In FIG. 3A and FIG. 3B, the "main part" refers to a part of the second lead 22 other than the extended portion 22h, and has a substantially rectangular external shape in a plan view.

In the resin package 10, the first lead 21 and the second lead 22 are disposed spaced away from each other at a predetermined interval. The lateral portion 21d of the first lead 21 faces the lateral portion 22c of the second lead 22.

In the present embodiment, in a plan view, the area of the first lead 21 is larger than the area of the second lead 22. This is because the element mounting region 21r is provided in the first lead 21. However, the relative sizes of the first lead 21 and the second lead 22 in a plan view are not limited to this example. For example, when the element mounting region 21r is provided in the second lead, the area of the second lead 22 may be larger than the area of the first lead 21 in a plan view. The element mounting region 21r may extend over both the first lead 21 and the second lead 22. In this case, the first lead 21 and the second lead 22 may have substantially the same area in a plan view. In the case where the plurality of leads include the first lead 21, the second lead 22, and the third lead, and the first lead 21 is disposed between the second lead 22 and the third lead, for example, the second lead 22 and the third lead have substantially the same area, and the area of the first lead 21 is larger than the area of the second lead 22 and the third lead, in a plan view. In the case where the plurality of leads include the third lead, the element mounting region 21r is provided in the first lead 21.

The lateral edge groove 21g and the notches 25m, 25n, which are formed in the first lead 21, are formed in order to improve the adhesion between the resin body 30 and the first lead 21. The lateral edge groove 22g formed in the second lead 22 is formed in order to improve the adhesion between the resin body 30 and the second lead 22.

In a lead frame which will be described below, the extended portions 21h, 22h are parts of connecting portions that connects a main part of a portion to become the first lead 21 and a main part of a portion to become the second lead 22 to the frame. The lead frame includes a frame, a plurality of connecting portions, and a plurality of pairs of the main part of a portion to become the first lead 21 and the main part of a portion to become the second lead 22, which are connected by the plurality of connecting portions. The resin body 30 is integrally molded with the lead frame, and thereafter, cutting is performed at the coupling portions to perform singulation. Therefore, the extended portions 21h, 22h, which are parts of the coupling portions before the cutting, are exposed at the outer lateral surfaces 10c, 10d, 10e, 10f of the resin package 10 so as to be substantially in the same plane with the resin body 30. After singulation, the first lead 21 including both the main part of the first lead 21 and the extended portion 21h can be obtained. This is similar in the second lead 22.

Each of the first lead 21 and the second lead 22 includes a base and a metal layer covering the base. The base is preferably a plate-like member. The base contains a metal such as, for example, copper, aluminum, gold, silver, iron, nickel, or alloys thereof, phosphor bronze, copper-iron alloys, etc. These may be a single layer or may have a multilayer structure (e.g., clad material). It is particularly preferable that copper, which is inexpensive and good in heat dissipation, is used for the base. The metal layer contains, for example, silver, aluminum, nickel, palladium, rhodium, gold, copper, or alloys thereof, etc. The first lead 21 and the second lead 22 may have a region in which the metal layer is not provided. In the first lead 21 and the second lead 22, the metal layer at the upper surfaces 21a, 22a may be different from the metal layer at the lower surfaces 21b, 22b. For example, the metal layer at the upper surfaces 21a, 22a has a multilayer structure including a metal layer of nickel, and the metal layer at the lower surfaces 21b, 22b does not include a metal layer of nickel.

Figure 2C:
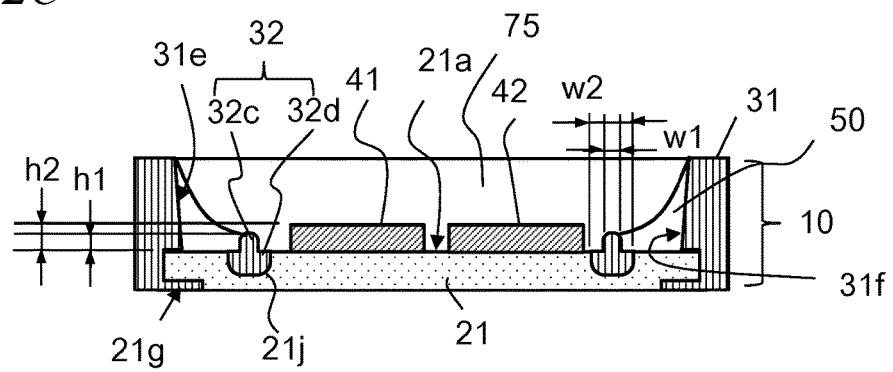
FIG. 2C is a schematic cross-sectional view of the light emitting device taken along a line 2C-2C of FIG. 2A.
Figure 2D:
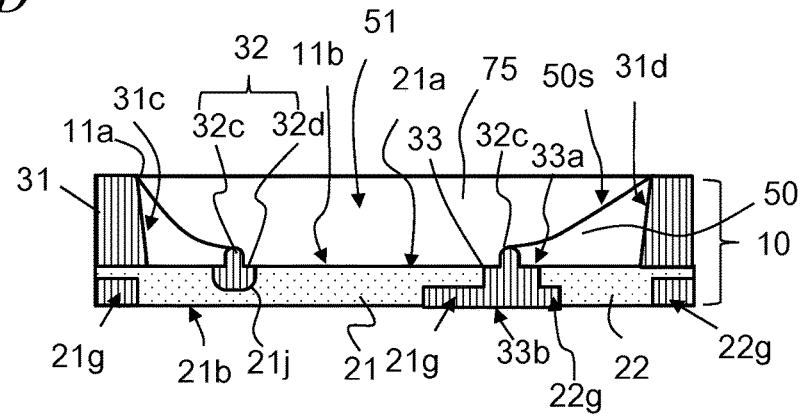
FIG. 2D is a schematic cross-sectional view of the light emitting device taken along a line 2D-2D of FIG. 2A.

In the case where a plating layer of silver or a silver alloy is formed at the outermost surface of the first lead 21 and the second lead 22, it is preferable that a protecting layer of silicon oxide, or the like, is provided over the surface of the plating layer of silver or a silver alloy. This protecting layer can prevent the plating layer of silver or a silver alloy from changing in color due to sulfur components or the like in the air. The protecting layer can be formed through a vacuum process such as, for example, sputtering, but any other known method may be employed. As shown in FIG. 2G, the protecting layer 70 (represented by a bold line) may be formed after the light emitting elements 41, 42 are mounted and connected via wires but before the light reflecting member 50 is formed, or may be formed on a portion of the plating layer after formation of the light reflecting member 50 as shown in FIG. 2H.

Resin Body 30

The resin body 30 is described with reference to FIG. 2B. The resin body 30 is integrally molded with the first lead 21 and the second lead 22. The resin body 30, the first lead 21 and the second lead 22 constitute the resin package 10. The resin body 30 includes a first resin portion 31, a second resin portion 32, a third resin portion 33, and first resin connecting portions 35m, 35n.

The first resin portion 31 has four lateral surfaces: inner wall surfaces 31c, 31d, 31e, 31f. The inner wall surfaces 31c, 31d, 31e, 31f, the first lead 21, and the second lead 22 define the recess 11. The inner wall surface 31c and the inner wall surface 31d face each other. The inner wall surface 31e and the inner wall surface 31f face each other.

The first resin portion 31 further includes the outer lateral surfaces 10c, 10d, 10e, 10f of the resin package 10. The outer lateral surfaces 10c, 10d, 10e, 10f are on the opposite side of the inner wall surfaces 31c, 31d, 31e, 31f, respectively.

As shown in FIG. 2B, adjacent two of the inner wall surfaces 31c, 31d, 31e, 31f are joined so as to form a curved surface, so that no clear border is formed between the inner wall surfaces. The opening 11a of the recess 11 has an approximately quadrangular external shape in a plan view and has four rounded corners. In a plan view, the periphery of the bottom surface 11b is rounded at the four corners with an arc of a greater radius than the four corners of the periphery of the opening 11a.

The second resin portion 32 is disposed at the bottom surface 11b of the recess 11 and arranged so as to surround the element mounting region 21r. The second resin portion 32 demarcates the inner periphery of the light reflecting member 50 and prevents the light reflecting member 50 from covering the lateral surfaces of the light emitting elements 41, 42. With the light reflecting member 50 that does not directly cover the lateral surfaces of the light emitting elements 41, 42, light laterally emitted from the light emitting elements 41, 42 can be prevented from being confined in the light reflecting member 50. As shown in FIG. 2C, the second resin portion 32 is disposed in the first groove 21j formed in the upper surface 21a. The second resin portion 32 includes a second portion 32d, which is disposed below a plane that includes the upper surface 21a, and a first portion 32c, which is disposed on the second portion 32d and located above the plane that includes the upper surface 21a. In the present embodiment, the first portion 32c of the second resin portion 32 has a height h1 from the upper surface 21a of the first lead 21 and a width w1. The first portion 32c has an annular shape which surrounds the element mounting region 21r with no discontinuity.

As shown in FIG. 2B, a part of the first portion 32c is located on the upper surface 21a, another part of the first portion 32c is located on the second portion 32d in the first groove 21j, and the remaining part of the first portion 32c is located on an upper surface 33a of the third resin portion 33 which will be described later. It is preferable that the first groove 21j has a width w2 is greater than the width w1 of the first portion 32c. Accordingly, the contact area between the second resin portion 32 and the first lead 21 increases, and reduction in width w1 of the first portion 32c allows for sufficiently securing a path through which a material of the light reflecting member 50 is flown at the time of forming the light reflecting member 50, which will be described below. That is, the second resin portion 32 on the upper surface 21a can be prevented from separating from the first lead 21, while the light reflecting member 50 can be efficiently formed. Further, by reducing width w1 of the first portion 32c, the light reflecting surface (i.e., slope surface 50s) of the light reflecting member 50 can be easily sloped. As a result, light emitted from the light emitting elements 41, 42 can be efficiently extracted upward.

It is preferable that the first portion 32c has a height h1 from the upper surface 21a that is smaller than a height h2 of the light emitting elements 41, 42 from the upper surface 21a. With such a height, light emitted from the light emitting elements 41, 42 can be easily incident on the slope surface 50s of the light reflecting member 50 and can be efficiently emitted to the outside through the opening 11a.

Figure 2E:
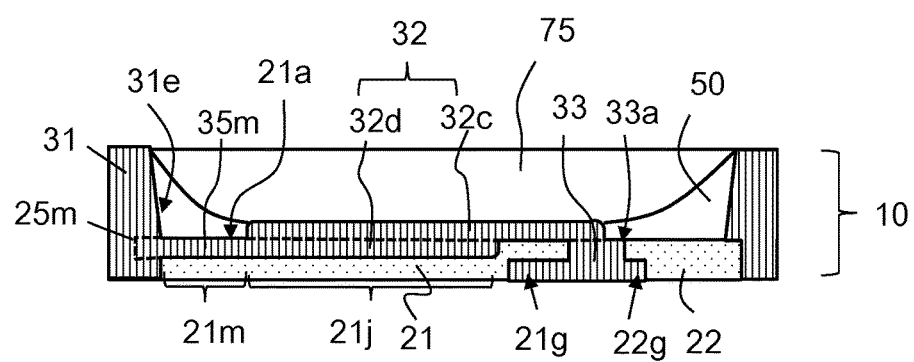
FIG. 2E is a schematic cross-sectional view of the light emitting device taken along a line 2E-2E of FIG. 2A.
Figure 2F:
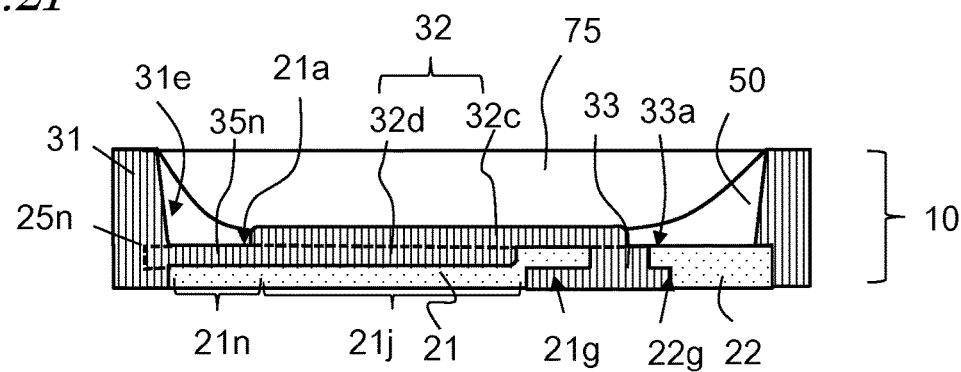
FIG. 2F is a schematic cross-sectional view of the light emitting device taken along a line 2F-2F of FIG. 2A.
Figure 2G:
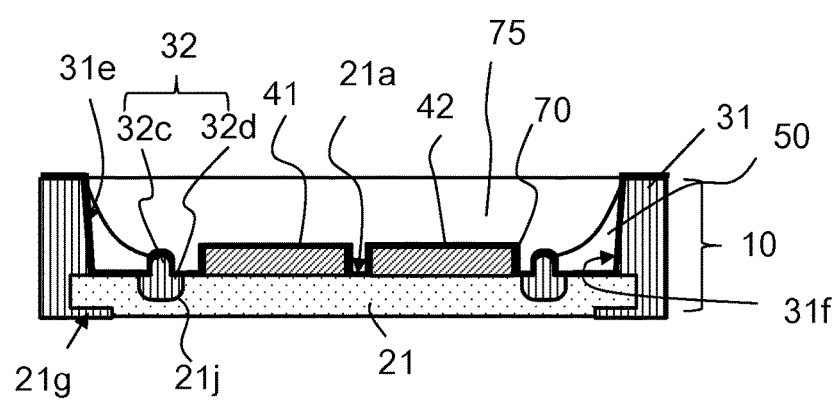
FIG. 2G is a schematic cross-sectional view of the light emitting device taken along a line 2C-2C of FIG. 2A, showing an example in which a protecting layer is provided.
Figure 2H:
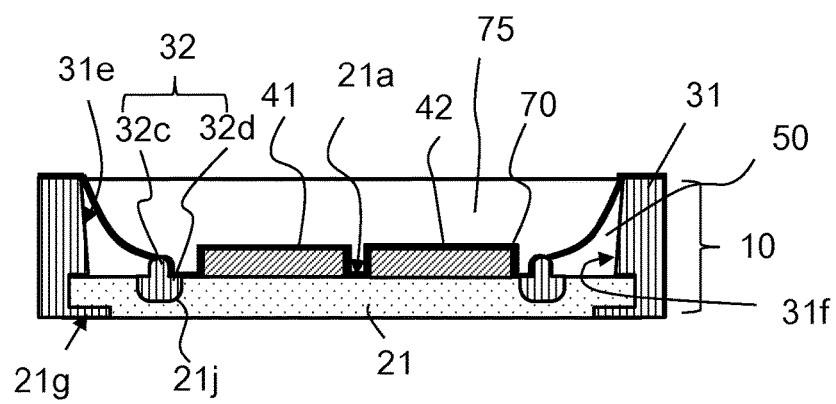
FIG. 2H is a schematic cross-sectional view of the light emitting device taken along the line 2C-2C of FIG. 2A, showing another example in which a protecting layer is provided.

As shown in FIG. 2E and FIG. 2F, the first resin connecting portions 35m, 35n are parts of the resin body 30 between the second resin portion 32 and the first resin portion 31. The first resin connecting portions 35m, 35n connect the second resin portion 32 with the first resin portion 31. In the present embodiment, the first resin connecting portions 35m, 35n are disposed in the second grooves 21m, 21n of the first lead 21, respectively. The first resin connecting portions 35m, 35n are joined with the second resin portion 32 and with a part of the inner wall surface 31c of the first resin portion 31 at a border with the bottom surface 11b. More specifically, one end of the first resin connecting portion 35m, 35n is joined with the second portion 32d of the second resin portion 32. The other end of the first resin connecting portion 35m is in contact with the inner wall surface 31e of the first resin portion 31, and is joined with a portion of the first resin portion 31 between the lower surface 21b of the first lead 21 and the lower edge of the inner wall surface 31e. The other end of the first resin connecting portion 35n is in contact with the inner wall surface 31f of the first resin portion 31, and is joined with a portion of the first resin portion 31 between the lower surface 21b of the first lead 21 and the lower edge of the inner wall surface 31f.

In the present embodiment, the first resin connecting portions 35m, 35n do not protrude from the upper surface 21a of the first lead 21. The upper surface 35a of the first resin connecting portions 35m, 35n and the upper surface 21a of the first lead 21 are at substantially the same height. Therefore, when an uncured resin material for the light reflecting member 50 is ejected onto the bottom surface 11b of the recess 11, the uncured resin material can flow over the bottom surface 11b without being interrupted by the first resin connecting portions 35m, 35n. The first resin connecting portions 35m, 35n may protrude from the upper surface 21a of the first lead 21. For example, in the case where the first lead 21 does not have the second grooves 21m, 21n in the upper surface 21a, the first resin connecting portions 35m, 35n protrude from the upper surface 21a of the first lead 21. In the case where the first resin connecting portions 35m, 35n protrudes from the upper surface 21a of the first lead 21, it is preferable that the height of the first resin connecting portions 35m, 35n is lower than the height of the second resin portion 32. With such a height, the uncured resin material for the light reflecting member 50 can spread over the bottom surface 11b without interruption of the flowage of the uncured resin material.

As represented by a broken line in FIG. 2E and FIG. 2F, the notches 25m, 25n of the first lead 21 are provided inside the first resin portion 31, and the notches 25m, 25n are filled with a part of the first resin portion 31. The notches 25m, 25n are joined with respective one of the second grooves 21m, 21n, so that the second resin portion 32 is connected with the first resin portion 31 by the first resin connecting portions 35m, 35n that are present inside the second grooves 21m, 21n.

The third resin portion 33 is a part of the resin body 30 between the first lead 21 and the second lead 22. The third resin portion 33 has an upper surface 33a and a lower surface 33b. The upper surface 33a is disposed at the bottom surface 11b of the recess 11. The upper surface 33a is at the same height as the upper surface 21a of the first lead 21 and the upper surface 22a of the second lead 22. The upper surface 33a does not extend above the upper surface 21a of the first lead 21 or the upper surface 22a of the second lead 22. The lower surface 33b is located at the lower surface 10b of the resin package 10. The third resin portion 33 is joined with a wall part of the first resin portion 31 which has the inner wall surface 31e and with a wall part of the first resin portion 31 which has the inner wall surface 31f. For example, in the case where the plurality of leads include a third lead, the third resin portion 33 is disposed between the first lead 21 and the second lead 22. The third resin portion 33 may also be disposed between the second lead 22 and the third lead.

a part of the first portion 32c of the second resin portion 32 is located on the upper surface 33a of the third resin portion 33 as described above. With this positional relationship between the second resin portion 32 and the third resin portion 33, at the time of pouring an uncured resin material which is to be the resin body 30 into a mold using a molding method, the resin material can be guided from a space inside the mold for formation of the third resin portion 33 into another space inside the mold for formation of the second resin portion 32.

In the second resin portion 32, the second portion 32d of the second resin portion 32 is connected with the first resin portion 31 by the first resin connecting portions 35m, 35n at the bottom surface 11b of the recess 11. A part of the first portion 32c of the second resin portion 32 is located on the upper surface 33a of the third resin portion 33 and is joined with the third resin portion 33. With this arrangement, the second resin portion 32 is prevented from separating and falling off from the resin package 10. With the second portion 32d of the second resin portion 32 and the first resin connecting portions 35m, 35n disposed inside the first groove 21j and the second grooves 21m, 21n of the first lead 21, the contact area with the first lead 21 is increased, so that the adhesion is improved, compared with a case where they are provided on the upper surface 21a of the first lead 21. Thus, it is possible to more securely dispose the second resin portion 32 at the bottom surface 11b.

For a base material of the resin body 30, a thermosetting resin, a thermoplastic resin, or the like, can be used. More specific examples of the base material include cured substances of epoxy resin compositions, silicone resin compositions, modified epoxy resin compositions such as silicone-modified epoxy resins, modified silicone resin compositions such as epoxy-modified silicone resins, unsaturated polyester resins, saturated polyester resins, polyimide resin compositions, modified polyimide resin compositions, and the like, polyphthalamide (PPA), polycarbonate resins, polyphenylene sulfide (PPS), liquid crystalline polymer (LCP), ABS resins, phenolic resins, acrylic resins, and PBT resins. It is particularly preferable to use a thermosetting resin such as an epoxy resin composition or a modified silicone resin composition. As described above, the first resin portion 31, the second resin portion 32, the third resin portion 33 and the first resin connecting portions 35m, 35n are integrally joined and therefore can be made of the same resin material. The viscosity of the uncured resin body 30 is preferably 10 pa·s to 40 pa·s, more preferably 15 pa·s to 25 pa·s. With such viscosity, the first resin portion 31, the second resin portion 32, the third resin portion 33 and the first resin connecting portions 35m, 35n can be formed with a good flowability by a molding method with use of a mold.

The resin body 30 may have a low reflectance with respect to the external light of the light emitting device (typically, sunlight) in order to improve the contrast of the light emitting device. In this case, it is generally preferable that the resin body 30 has a black color or a color similar to black. The filler used in such a case can be carbon such as acetylene black, activated carbon, or graphite, a transfer metal oxide such as iron oxide, manganese dioxide, cobalt oxide, or molybdenum oxide, or a color organic pigment, which can be selected according to the purpose of use.

Light Emitting Elements 41, 42

For the light emitting elements 41, 42, a semiconductor light emitting element, such as a light-emitting diode element, can be used. In the present embodiment, the light emitting device 101 includes two light emitting elements, although the light emitting device 101 may include one light emitting element or three or more light emitting elements. It is particularly preferable that the light emitting elements 41, 42 include a nitride semiconductor ($In_xAl_yGa_{1-x-y}N$, $0 \le x$, $0 \le y$, $x+y \le 1$) configured to emit in the range of ultraviolet to visible light. For example, the light emitting elements 41, 42 may emit blue light and green light, respectively. In the case where the light emitting device includes three light emitting elements, the three light emitting elements may emit blue light, green light, and red light, respectively.

The light emitting elements 41, 42 are mounted in the element mounting region 21r of the first lead 21 and joined to the first lead 21 by a joining material. Examples of the joining material include resins which include the resin material illustrated in the resin body 30, solders such as tin-bismuth solder, tin-copper solder, tin-silver solder, and gold-tin solder, electrically-conductive pastes of silver, gold, and palladium, bumps, anisotropic conductive materials, filler materials of low melting metals, etc. In the present embodiment, the light emitting elements 41, 42 are electrically connected with the first lead 21 and the second lead 22 by wires 43a, 43b, 43c, 43d. In the present embodiment, the light emitting element 41 and the light emitting element 42 are electrically connected in parallel between the first lead 21 and the second lead 22. Alternatively, the light emitting element 41 and the light emitting element 42 may be electrically connected in series.

Light Reflecting Member 50

The light reflecting member 50 is adapted to reflect light emitted from the light emitting elements 41, 42 toward the opening 11a. The light reflecting member 50 is provided in a region surrounded by the inner wall surfaces 31c, 31d, 31e, 31f of the recess 11 and the second resin portion 32 (i.e., disposed between the inner wall surfaces 31c, 31d, 31e, 31f and the second resin portion 32). More specifically, the light reflecting member 50 is disposed in the recess 11 so as to cover the inner wall surfaces 31c, 31d, 31e, 31f, the upper surface 21a of the first lead 21 outside the second resin portion 32, a part of the upper surface 22a of the second lead 22, and the upper surface 33a of the third resin portion 33. The light reflecting member 50 is not disposed at an inner side of the second resin portion 32, i.e., in the element mounting region 21r.

The light reflecting member 50 has a slope surface 50s between the inner wall surfaces 31c, 31d, 31e, 31f and the second resin portion 32. The slope surface 50s is recessed toward the bottom surface 11b side of the recess 11. The light reflecting member 50 can reflect light emitted from the light emitting elements 41, 42 toward the opening 11a, which allows for improving light extraction efficiency of the light emitting device 101.

The slope angle formed by a line connecting the upper and lower edges of the slope surface 50s of the light reflecting member 50 and the bottom surface 11b of the recess 11 can be smaller than the slope angle formed by a line connecting the upper and lower edges of the slope surface of an inner wall surface of the resin package 10 and the bottom surface 11b of the recess 11. The light reflecting member 50 that can be formed to reach the vicinity of the light emitting element allows for having such relationship of the slope angles. With such slope angles, the light reflecting member 50 can efficiently reflect light emitted from the light emitting elements 41, 42 toward the opening 11a.

The light reflecting member 50 is preferably made of a material which is unlikely to transmit or absorb light from the light emitting element or external light. The light reflecting member 50 preferably has a white color. For example, for a base material of the light reflecting member 50, a thermosetting resin, a thermoplastic resin, or the like, can be used. More specifically, phenolic resins, epoxy resins, BT resins, PPA, and silicone resins can be used. By adding, to such a base material, light-scattering particles of a reflective material which is unlikely to absorb light emitted from the light emitting element and has a large refractive index difference from the refractive index of the basic constituent resin (e.g., titanium oxide, zinc oxide, silicon oxide, zirconium oxide, aluminum oxide, aluminum nitride) such that the light-scattering particles are dispersed in the base material, light can be efficiently reflected. It is preferable that the viscosity of the uncured light reflecting member 50 is lower than that of the uncured resin body 30. For example, the viscosity of the uncured light reflecting member 50 is preferably 1 pa·s to 20 pa·s, more preferably 5 pa·s to 15 pa·s. With such a viscosity, in the recess 11, the light reflecting member 50 can greatly wet-spread, so that the probability of insufficient filling of the light reflecting member 50 can be decreased. It is preferable that the uncured light reflecting member 50 has high thixotropy.

The light reflecting member 50 preferably has higher light reflectance than that of the resin body 30. For example, the content of a light-reflecting substance (e.g., titanium oxide) in the light reflecting member 50 is greater than the content of the light-reflecting substance in the resin body 30. More specifically, the content of the light-reflecting substance in the light reflecting member 50 is preferably 1.5 times ore greater, more preferably 2 times or greater, and still more preferably 2.5 times or greater as great as the content of the light-reflecting substance in the resin body 30. For example, the content of titanium oxide in the light reflecting member 50 is 40 weight % of the total weight of the uncured resin material, while the content of titanium oxide in the resin body 30 is 15 to 20 weight % of to the total weight of the uncured resin material.

Protection Element 60

The light emitting device 101 may include a protection element 60 for improving the resistance against electrostatic breakdown. The protection element 60 can be selected from various protection elements which are to be incorporated in common light emitting devices. For example, a Zener diode can be used as the protection element 60. In the light emitting device 101, the protection element 60 and the light emitting elements 41, 42 are electrically connected in parallel.

The protection element 60 can be disposed on, for example, the upper surface 22a of the second lead 22 as illustrated at an inner side of a broken line in FIG. 2B. The protection element 60 is buried in the light reflecting member 50. This arrangement allows for preventing light emitted from the light emitting elements 41, 42 from being absorbed by the protection element 60.

One of the two terminals of the protection element 60 is electrically connected with the upper surface 21a of the first lead 21 by a joining material. Examples of the joining material include solders such as tin-bismuth solder, tin-copper solder, tin-silver solder, and gold-tin solder, electrically-conductive pastes of silver, gold, and palladium, bumps, anisotropic conductive materials, brazing materials of low melting metals, etc. The other terminal of the protection element 60 is connected with, for example, the upper surface 21a of the first lead 21 by a wire 61.

Encapsulant 75

The light emitting device 101 may include a sealing member 75. The sealing member 75 is disposed inside a recess 51 formed by the slope surface 50s of the light reflecting member 50 in the recess 11 and covers the light emitting elements 41, 42 disposed at the bottom of the recess 51. The sealing member 75 can protect the light emitting elements 41, 42 from external force, dust, moisture, etc.

The sealing member 75 transmits preferably 60% or more, more preferably 90% or more, of the light emitted from the light emitting elements 41, 42. The material of the sealing member 75 can be the same resin material as that used for the resin body 30. For the base material of the sealing member 75, a thermosetting resin, a thermoplastic resin, or the like, can be used. For example, a silicone resin, an epoxy resin, an acrylic resin, or a resin containing one or more of these resins can be used. The sealing member 75 can be made of a single layer or, alternatively, can be made of a plurality of layers. In the sealing member 75, light-scattering particles such as titanium oxide, silicon oxide, zirconium oxide, aluminum oxide, or the like may be dispersed in the sealing member 75.

The sealing member 75 may contain a material for converting the wavelength of the light emitted from the light emitting elements 41, 42 (e.g., phosphor). Specific examples of the phosphor include yttrium aluminum garnet activated with cerium, lutetium aluminum garnet activated with cerium, nitrogen-containing calcium aluminosilicate activated with europium and/or chromium (part of calcium are replaceable by strontium), sialon activated with europium, silicate activated with europium, strontium aluminate activated with europium, and potassium fluorosilicate activated with manganese.

The content of the light-scattering particles and/or phosphor is preferably about 10 to 100 weight % of the total weight of the sealing member 75.

Figure 2I:
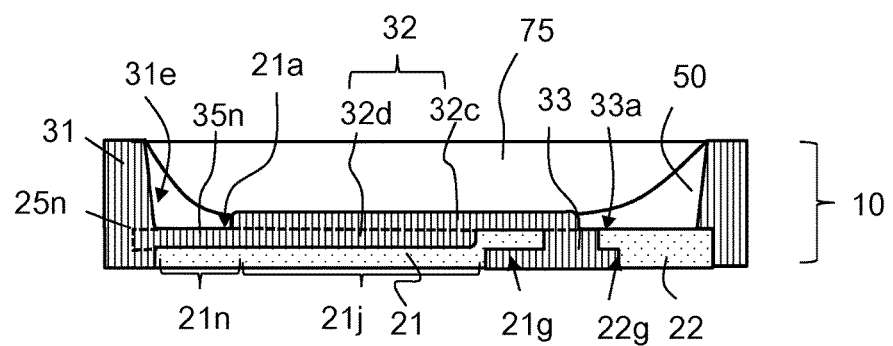
FIG. 2I is a schematic cross-sectional view of the light emitting device taken along the line 2C-2C of FIG. 2A, showing another example of the sealing member.

The sealing member 75 may include a plurality of sealing portions. For example, as shown in FIG. 2I, the sealing member 75 includes a first sealing portion 75a and a second sealing portion 75b. The first sealing portion 75a is disposed in an inner region defined by the upper surface of the second resin portion 32 and the second resin portion 32 (i.e., a region including the element mounting region) so as to enclose the light emitting elements 41, 42. The second sealing portion 75b is disposed on the first sealing portion 75a. In the sealing member 75 having such a structure, for example, with the first encapsulating portion 75a containing a phosphor adapted to emit light of a long wavelength and the second sealing portion 75b containing a phosphor adapted to emit light of a short wavelength, mutual absorption of light by the phosphors can be reduced. For example, the first encapsulating portion 75a contains a red phosphor, and the second encapsulating portion 75b contains a yellow or blue phosphor.

Figure 2J:
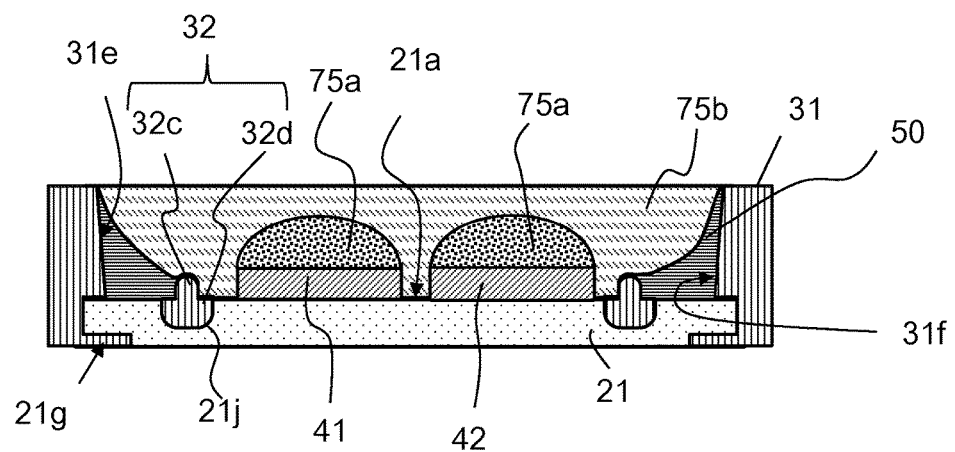
FIG. 2J is a schematic cross-sectional view of the light emitting device taken along line the 2C-2C of FIG. 2A, showing still another example of the sealing member.

FIG. 2J shows another example where the sealing member 75 includes a plurality of sealing portions. The sealing member 75 shown in FIG. 2J includes a first sealing portion 75a and a second sealing portion 75b. The first sealing portion 75a is disposed on the upper surface of each of the light emitting elements 41, 42. More specifically, the first sealing portion 75a covers the upper surface of the light emitting elements 41, 42 but does not cover the lateral surfaces of the light emitting elements 41, 42. The second sealing portion 75b is disposed over the first sealing portion 75a, and covers the upper surface of the first sealing portion 75a and the lateral surfaces of the light emitting elements 41, 42. In the thus-configured sealing member 75, for example, the first sealing portion 75a contains a phosphor adapted to emit light of a longer wavelength, and the second sealing portion 75b contains a phosphor adapted to emit light of a shorter wavelength. With a phosphor adapted to emit light of a longer wavelength disposed on the upper surface (i.e., emission surface) side of the light emitting elements 41, 42, which provide greater light intensity, a large part of light emitted from the light emitting elements 41, 42 can be efficiently absorbed by the phosphor adapted to emit light of a longer wavelength. Accordingly, mutual absorption of light by the phosphor contained in the first sealing portion 75a and the phosphor contained in the second sealing portion 75b can be reduced. For example, the first sealing portion 75a contains a red phosphor, and the second sealing portion 75b contains a yellow or blue phosphor.

Manufacturing Method of Light Emitting Device 101

A method of manufacturing the light emitting device according to one embodiment of the present disclosure will be described. The method of manufacturing the light emitting device of the present disclosure includes (A) providing a collective substrate, and (B) singulating the collective substrate to obtain a plurality of light emitting devices. The respective steps will be described in detail below.

(A) Providing a Collective Substrate

Figure 4A:
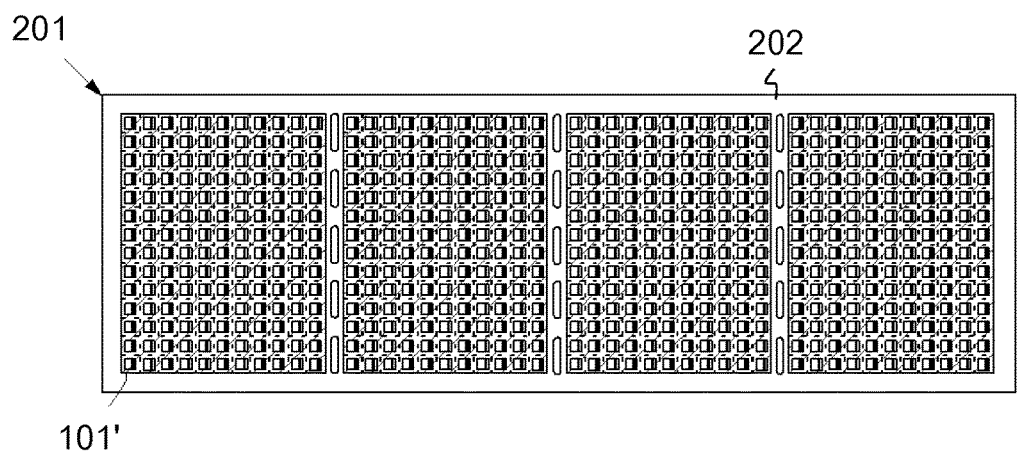
FIG. 4A is a schematic top view of a collective substrate 201.
Figure 4B:
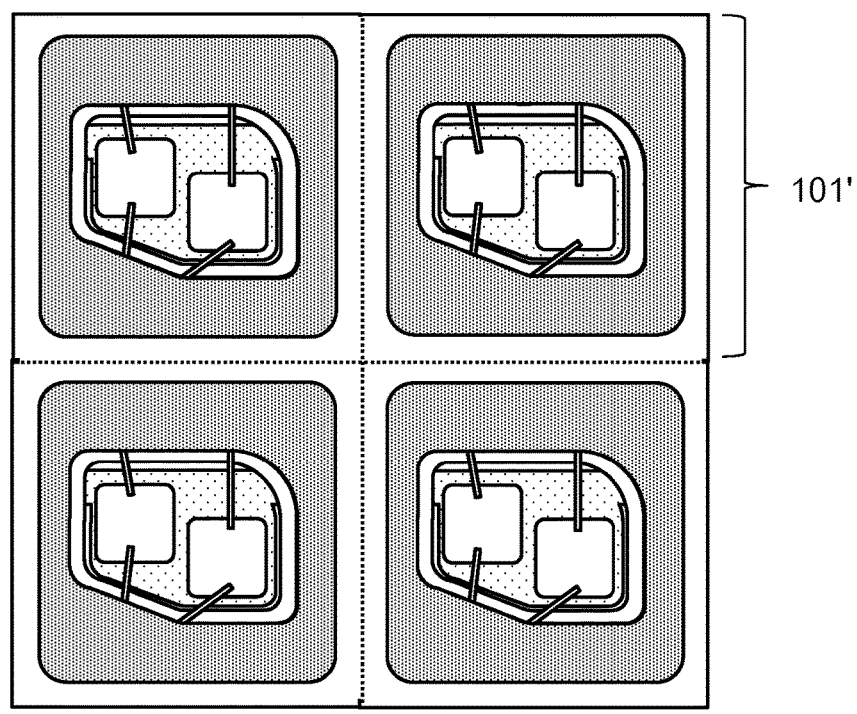
FIG. 4B is a schematic top view showing four planned light emitting device regions 101'.

FIG. 4A is a schematic top view of a collective substrate 201. In the collective substrate 201, portions which are to be a plurality of light emitting devices (hereinafter, referred to as "planned light emitting device region 101") are two-dimensionally arranged. FIG. 4B is a schematic top view showing four planned light emitting device regions 101'. The planned light emitting device regions 101' have the same configuration as that of the light emitting device 101 that has been described above with reference to FIG. 1A to FIG. 3B except that the planned light emitting device regions 101' are not yet singulated.

Figure 5:
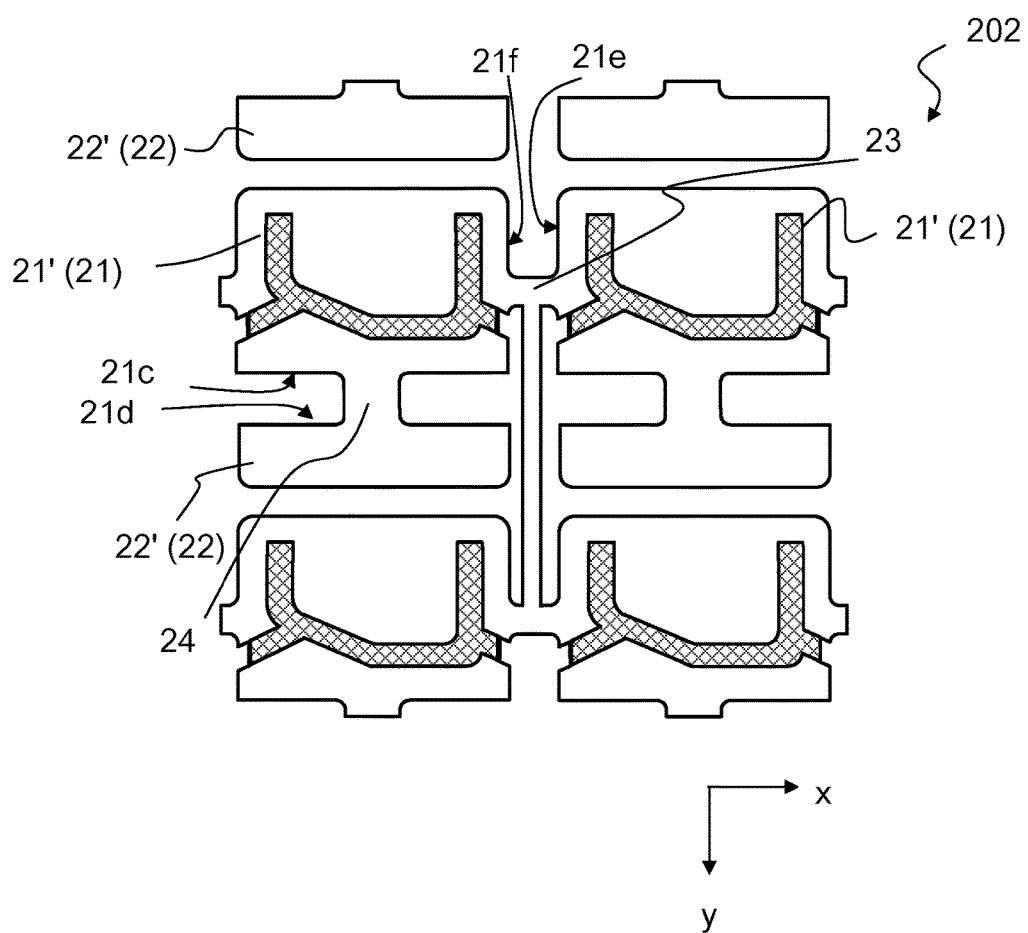
FIG. 5 is a schematic top view showing portions of a lead frame corresponding to the four planned light emitting device regions 101'.

A resin body 30 is formed over a lead frame 202 which includes a plurality of pairs of a portion which is to be the first lead 21 (hereinafter, referred to as "planned first lead region 21'") and a portion which is to be the second lead 22 (hereinafter, referred to as "planned second lead region 22'"). FIG. 5 shows a portion of the lead frame 202 which includes the plurality of pairs of the planned first lead region 21' and the planned second lead region 22', corresponding to the four planned light emitting device regions 101' in FIG. 4. In the lead frame 202, the planned first lead regions 21' and the planned second lead regions 22' are alternately arranged in the y direction. In the x direction, a plurality of planned first lead regions 21' or a plurality of planned second lead regions 22' are arranged.

In they direction, a lateral portion 21c of a planned first lead region 21' and the lateral portion 22d of a planned second lead region 22' are connected by a connecting portion 24. In the x direction, a lateral portion 21f of a planned first lead region 21' and the lateral portion 21e of an adjacent planned first lead region 21' are connected by a connecting portion 23.

Formation of the resin body 30 over the lead frame 202 can be performed by, for example, transfer molding, injection molding, or compression molding.

Figure 6A:
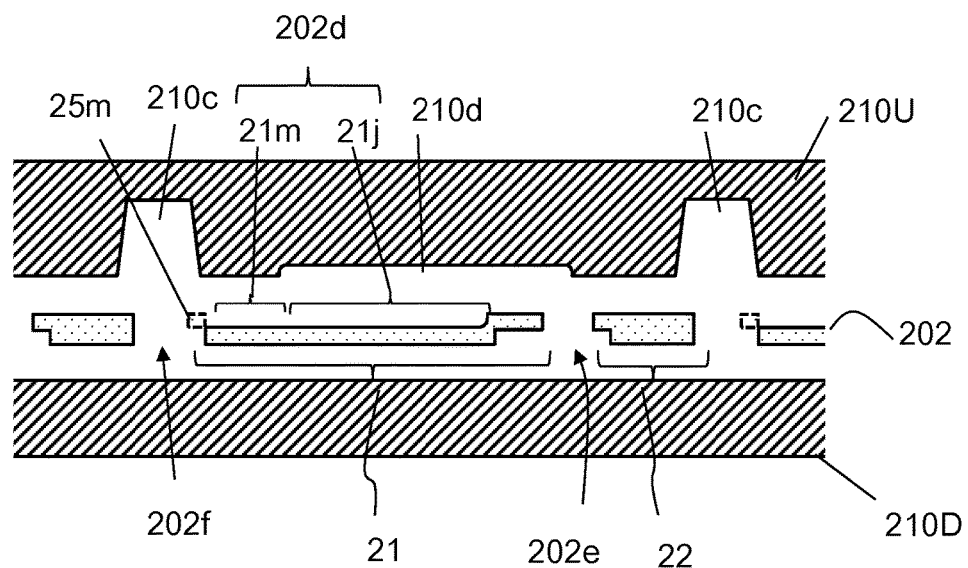
FIG. 6A is a cross-sectional view illustrating a step in a method of manufacturing a light emitting device.

Then, as shown in FIG. 6A, the lead frame 202 is disposed between an upper die 210U and a lower die 210D of a mold. FIG. 6A shows a part of the lead frame 202 corresponding to the cross sectional view of the light emitting device 101 shown in FIG. 2E. The upper die 210U defines a first hollow 210c for formation of the first resin portion 31 and a second hollow 210d for formation of the first portion 32c of the second resin portion 32. In the upper die 210U, the second hollow 210d is a separate space which is not in communication with the first hollow 210c. In the present embodiment, the lower die 210D defines no hollow.

The lead frame 202 defines a third hollow 202e, a forth hollow 202d on an upper surface side, and a fifth hollow 202f. The third hollow 202e corresponds to a shape of the third resin portion 33. The third hollow 202e is for formation of the third resin portion 33. In the forth hollow 202d of the lead frame 202, the first groove 21j and the second groove 21m of the first lead 21 are disposed. The forth hollow 202d is for formation of the second portion 32d of the second resin portion 32 and the first resin connecting portions 35m, 35n. The fifth hollow 202f is for formation of a part of the first resin portion 31. In the fifth hollow 202f, the notches 25m, 25n are disposed.

As described above, in the upper die 210U, the first hollow 210c is separate from the second hollow 210d. However, when the lead frame 202 is disposed between the upper die 210U and the lower die 210D and the upper die 210U and the lower die 210D is attached to the lead frame 202, the first hollow 210c is in communication with the second grooves 21m, 21n which are part of the forth hollow 202d of the lead frame 202. The second hollow 210d of the upper die 210U is in communication with the first groove 21j which is a part of the forth hollow 202d of the lead frame 202. The second hollow 210d of the upper die 210U is in communication with the third hollow 202e of the lead frame 202.

Figure 6B:
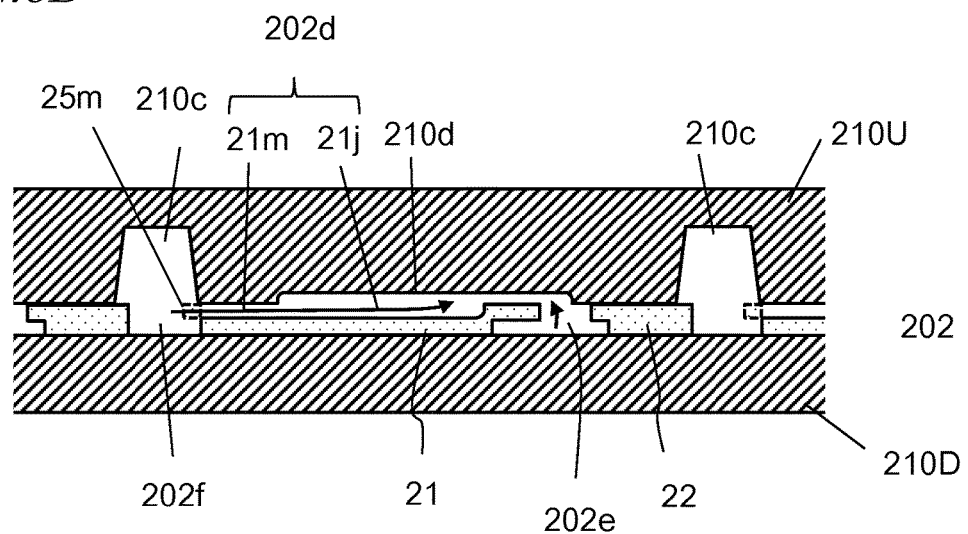
FIG. 6B is a cross-sectional view illustrating a step in a method of manufacturing a light emitting device.

As shown in FIG. 6B, an uncured resin material which is to form the resin body 30 is injected into the above-described hollows between the upper die 210U and the lower die 210D of the mold. In this step, the above-described hollows of the upper die 210U and corresponding ones of the hollows of the lead frame 202 are in communication with one another, so that these hollows are filled with the uncured resin material. In particular, the uncured resin material injected into the first hollow 210c moves into the second hollow 210d via the notches 25m, 25n and the forth hollow 202d (the second grooves 21m, 21n and the first groove 21j) as represented by an arrow. The uncured resin material injected into the third hollow 202e moves from the third hollow 202e to the second hollow 210d as represented by an arrow. In this manner, the uncured resin material fills all of the hollows.

Thus, according to the light emitting device and the method of manufacturing the light emitting device of the present disclosure, the second grooves 21m, 21n of the first lead 21, in which the first resin connecting portions 35m, 35n of the resin body 30 are to be formed, function as paths to the second hollow 210d of the mold for formation of the second resin portion 32 at the time of forming the resin body 30. Therefore, when the resin package 10 is formed by molding with the use of a mold, the second resin portion 32 can be simultaneously formed.

In the process of injecting the resin material into the mold, the second hollow 210d is in communication with other hollows at a plurality of positions in the mold. Specifically, the second hollow 210d is in communication with the first hollow 210c, which is for formation of the first resin portion 31, via the forth hollow 202d (including the second grooves 21m, 21n and the first groove 21j) and is also in communication with the third hollow 202e that is for formation of the third resin portion 33. The uncured resin material is supplied into the second hollow 210d from a plurality of positions, so that the probability of insufficient filling of the second hollow 210d in the mold with the resin material can be decreased. Also, the uncured resin material can be substantially uniformly supplied in a short time period.

Figure 6C:
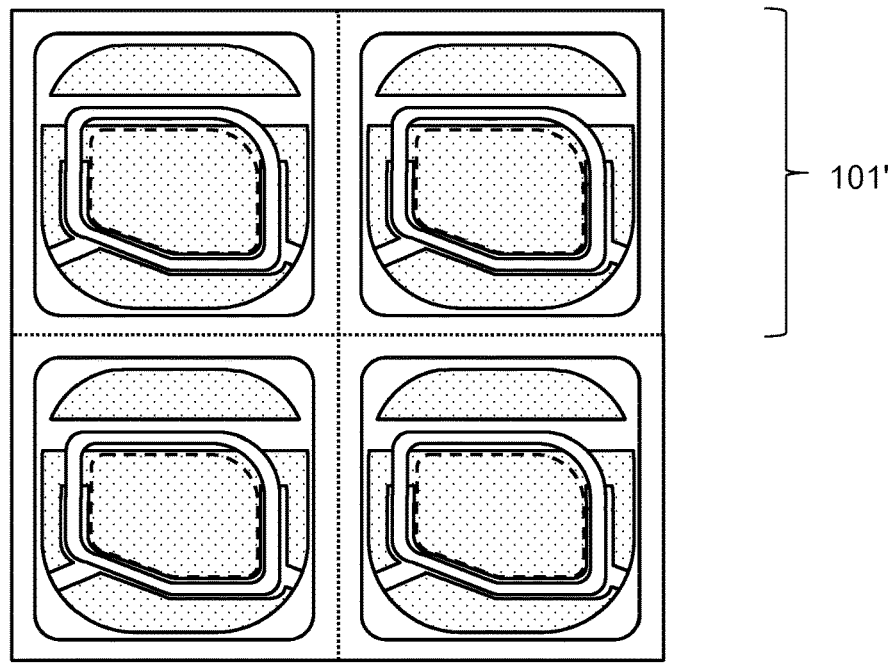
FIG. 6C is a schematic top view showing four resin packages.

After the uncured resin material is filled in the mold, the resin material in the mold is heated at a predetermined temperature to perform pre-curing. Thereafter, the resin material is removed from the mold and heated at a temperature higher than the temperature of the pre-curing to perform curing of the resin material. In this manner, a collective substrate (a lead frame with a resin molded structure) is produced in which the resin body 30 is provided over the lead frame 202. FIG. 6C is a schematic top view of four planned light emitting device regions 101' that has not been singulated.

The collective substrate may be provided by purchasing a manufactured collective substrate instead of manufacturing the collective substrate through the above-described method of manufacturing. The plurality of resin packages 10 may be integrally molded or may be separately molded. The present invention is not limited to using a collective substrate that includes a plurality of resin packages 10, and for example, a single resin package 10 may be alternatively provided.

Figure 7:
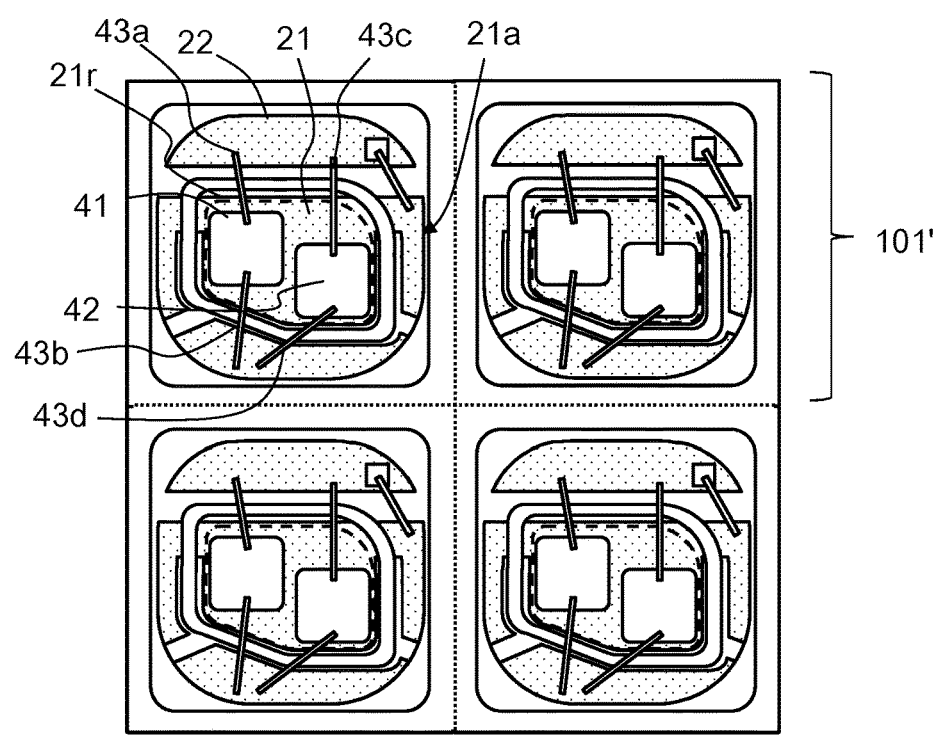
FIG. 7 is a schematic top view showing four resin packages in which light emitting elements are mounted.

As shown in FIG. 7, the light emitting elements 41, 42 are mounted on the bottom surface 11b of the recess 11 of the planned light emitting device region 101'. In the present embodiment, the light emitting elements 41, 42 are joined with the planned first lead region 21' using a bonding material such as the above-described resin. Further, wires 43a, 43b, 43c, 43d are disposed for electrically connecting the light emitting elements 41, 42 with the planned first lead region 21' and the planned second lead region 22'. When the light emitting device 101 includes a protection element 60, the protection element 60 is also mounted in the recess 11 in this step.

A light reflecting member 50 is formed in the recess 11 of the planned light emitting device region 101'. More specifically, an uncured resin material for the light reflecting member 50 is mounted on the bottom surface 11b of the recess 11 of the planned light emitting device region 101'. The light reflecting member 50 may be formed using a potting method. The potting method is a method in which a resin material is applied (dropped) and is disposed in an appropriate region using flowing of the resin material. According to the light emitting device and a method of manufacturing the light emitting device of the present disclosure, the second resin portion 32 is disposed around the element mounting region 21r, and therefore, the inner periphery of the uncured resin material can be demarcated by the second resin portion 32 even if the uncured resin material is moved by the utilization of its flowage. With the second resin portion 32 connected with the first resin portion 31 of the resin package 10 by the third resin portion 33 and the first resin connecting portions 35m, 35n, separation or detachment from the upper surface 21a can be prevented even if the second resin portion is disposed on the upper surface 21a of the first lead 21. Further, the third resin portion 33 and the first resin connecting portions 35m, 35n have the same height as that of the upper surface 21a of the first lead 21, so that the third resin portion 33 and the first resin connecting portions 35m, 35n do not interrupt the flow of the uncured resin material for the light reflecting member 50.

Thereafter, the uncured resin material to be the light reflecting member 50 is cured by heat or light. Further, a sealing member is poured into the recess 51 formed by the slope surface 50s of the light reflecting member 50 so as to cover the light emitting elements 41, 42, and then cured. Accordingly, a collective substrate 201 shown in FIG. 4A is obtained which includes a plurality of light emitting devices that has not been singulated.

(B) Singulating the Collective Substrate to Obtain a Plurality of Light Emitting Devices:

The collective substrate 201 is singulated, so that individual light emitting devices 101 are obtained. Singulating of the collective substrate 201 can be performed by various methods, such cutting with a lead-cutting mold, cutting with a dicing saw, and cutting with laser light. In the case where a plurality of resin packages are integrally formed, singulation of the collective substrate can be performed by simultaneously cutting the leads and the resin body. In the case where the resin packages are separately molded, singulation of the collective substrate can be performed by cutting only the leads.

Figure 8A:
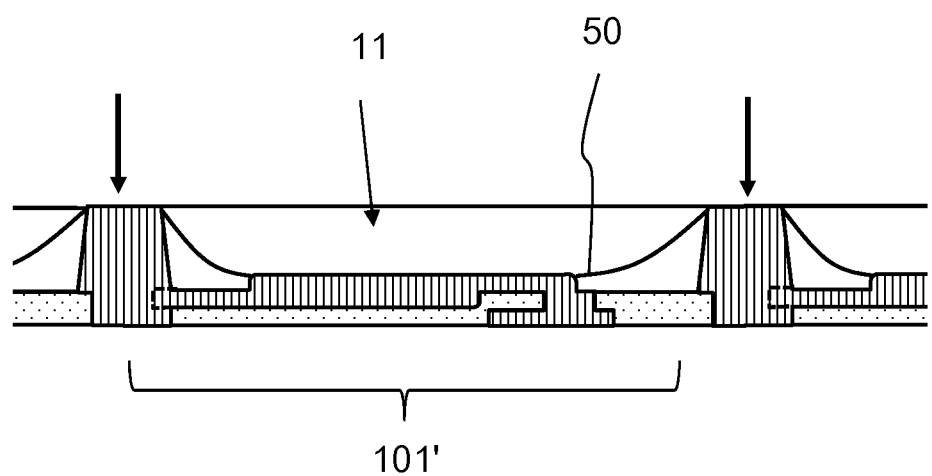
FIG. 8A is a cross-sectional view illustrating a step in a method of manufacturing a light emitting device.
Figure 8B:
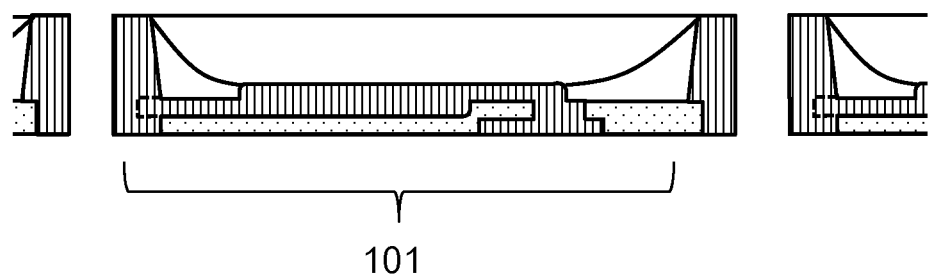
FIG. 8B is a cross-sectional view illustrating a step in a method of manufacturing a light emitting device.

As shown in FIG. 8A, the collective substrate 201 that includes a plurality of planned light emitting device regions 101', in which the light reflecting member 50 is provided in the recess 11, is cut at predetermined positions indicated by arrows. Accordingly, a plurality of light emitting devices 101 are obtained as shown in FIG. 8B.

Effects

In the light emitting device 101, the first resin connecting portions 35m, 35n are joined with the first resin portion 31, so that the second resin portion 32 can be prevented from separating from the bottom surface 11b of the recess 11. Therefore, with the inner periphery of the light reflecting member 50 is demarcated by the second resin portion 32 and the light reflecting member 50 disposed between the inner wall surface and the second resin portion 32 as described above, a light emitting device which has high extraction efficiency can be obtained.

Further, with the first resin connecting portions 35m, 35n and the second portion of the second resin portion 32 that are disposed inside the second grooves 21m, 21n and the first groove 21j which are provided in the upper surface 21a of the first lead 21, the contact area between the first lead 21 and the first resin connecting portions 35m, 35n and between the first lead 21 and the second resin portion 32 increases, and accordingly, adhesion can be improved.

The second resin portion 32 is joined with at least two portions of the first resin connecting portions 35m, 35n and the third resin portion 33. Therefore, at the time of injecting the uncured resin material using a molding method, the hollows for formation of the first resin connecting portions 35m, 35n and the third resin portion 33 function as paths to the hollow for formation of the second resin portion 32. Thus, insufficient filling of the second resin portion 32 can be prevented.

The first resin connecting portions 35m, 35n are parts of the resin body 30 which are disposed between the second resin portion 32 and the first resin portion 31. The first resin connecting portions 35m, 35n connect the second resin portion 32 with the first resin portion 31. In the present embodiment, the first resin connecting portions 35m, 35n are disposed in the second grooves 21m, 21n of the first lead 21, respectively. The first resin connecting portions 35m, 35n are joined with the second resin portion 32 and with parts of the inner wall surfaces 31e, 31f of the first resin portion 31 at borders with the bottom surface 11b. More specifically, one end portion of each of the first resin connecting portions 35m, 35n is joined with the second portion 32d of the second resin portion 32. The other end portion of the first resin connecting portion 35m is in contact with the inner wall surfaces 31e of the first resin portion 31 and is joined with a part of the first resin portion 31 between the lower surface 21b the first lead 21 and the lower end of the inner wall surface 31e. The other end portion of the first resin connecting portion 35n is in contact with the inner wall surfaces 31f of the first resin portion 31 and is joined with a part of the first resin portion 31 between the lower surface 21b the first lead 21 and the lower end of the inner wall surface 31f. As shown in FIG. 2D, in the present embodiment, the first resin connecting portions 35m, 35n do not protrude from the upper surface 21a of the first lead 21. The upper surface 35a of the first resin connecting portions 35m, 35n and the upper surface 21a of the first lead 21 are located at substantially the same heights. With this arrangement, when an uncured resin material for the light reflecting member 50 is ejected onto the bottom surface 11b of the recess 11, the uncured resin material can flow over the bottom surface 11b without being interrupted by the first resin connecting portions 35m, 35n. The first resin connecting portions 35m, 35n may protrude from the upper surface 21a of the first lead 21. For example, in the case where the upper surface 21a of the first lead 21 does not have the second grooves 21m, 21n, the first resin connecting portions 35m, 35n protrude from the upper surface 21a of the first lead 21. In the case where the first resin connecting portions 35m, 35n extend above the upper surface 21a of the first lead 21, it is preferable that a height of the first resin connecting portions 35m, 35n is smaller than a height of the second resin portion 32. With this arrangement, the uncured resin material for the light reflecting member 50 can spread over the bottom surface 11b without interrupting flowing of the uncured resin material.

Second Embodiment

Figure 9A:
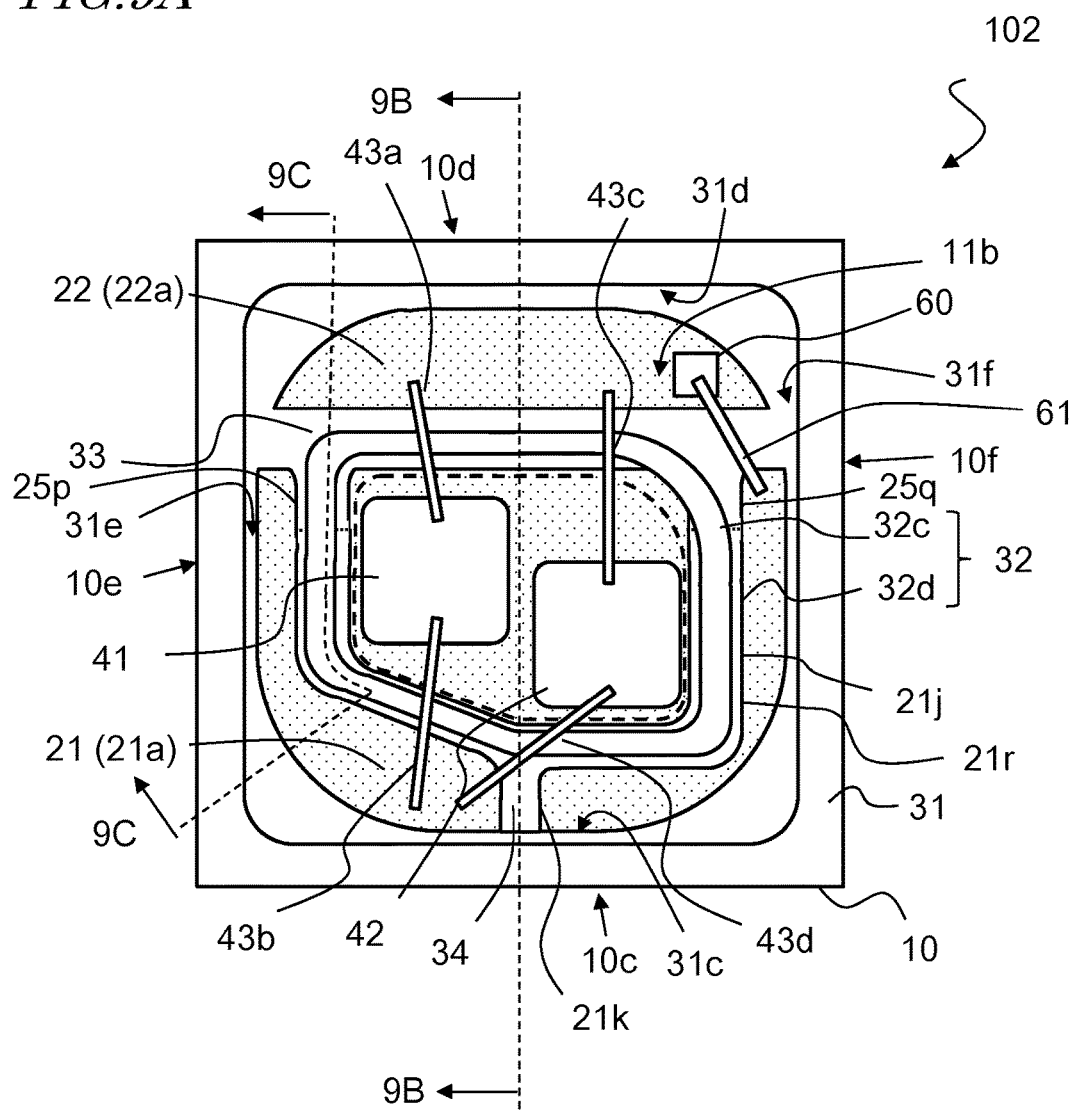
FIG. 9A is a schematic top view of a light emitting device of the second embodiment in which a light reflecting member is not shown.
Figure 9B:
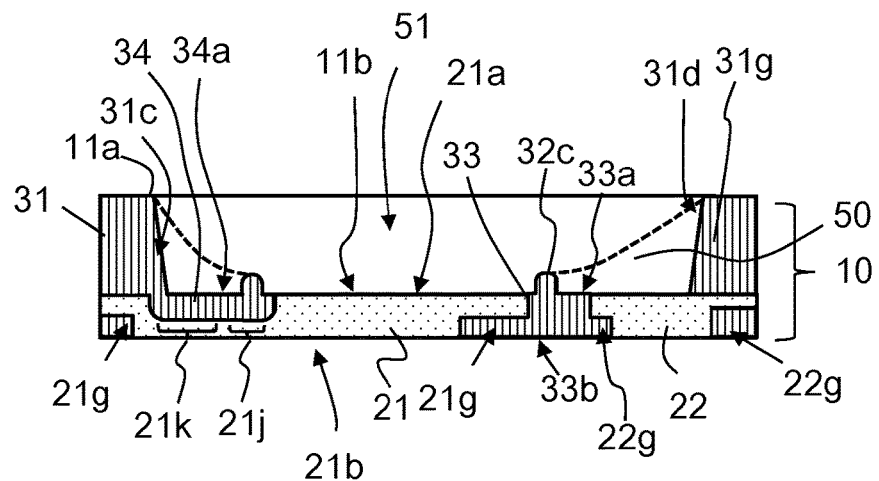
FIG. 9B is a schematic cross-sectional view of the light emitting device taken along a line 9B-9B of FIG. 9A.
Figure 9C:
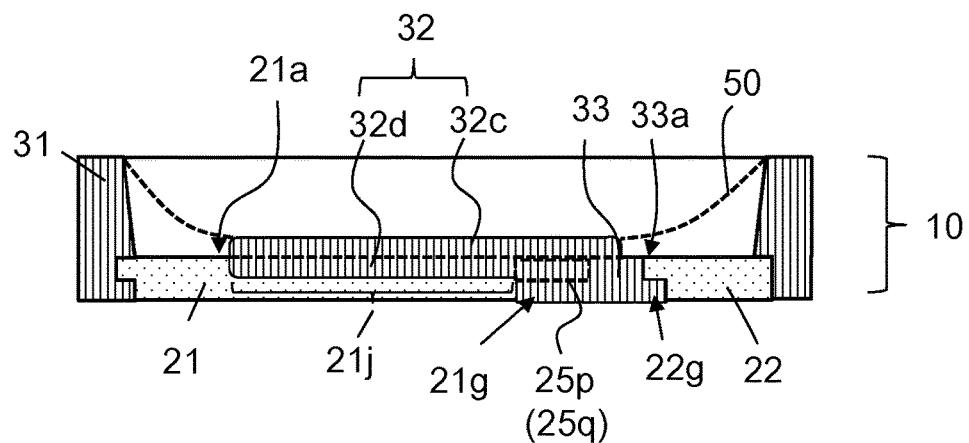
FIG. 9C is a schematic cross-sectional view of the light emitting device taken along a line 9C-9C of FIG. 9A.
Figure 10A:
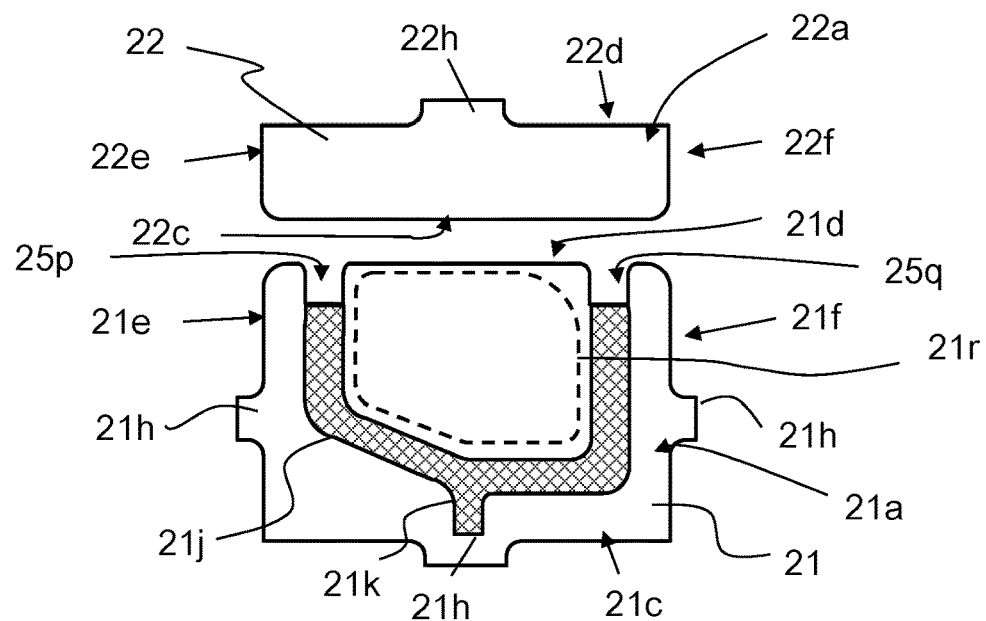
FIG. 10A is a schematic top view of a first lead and a second lead of the light emitting device of the second embodiment.
Figure 10B:
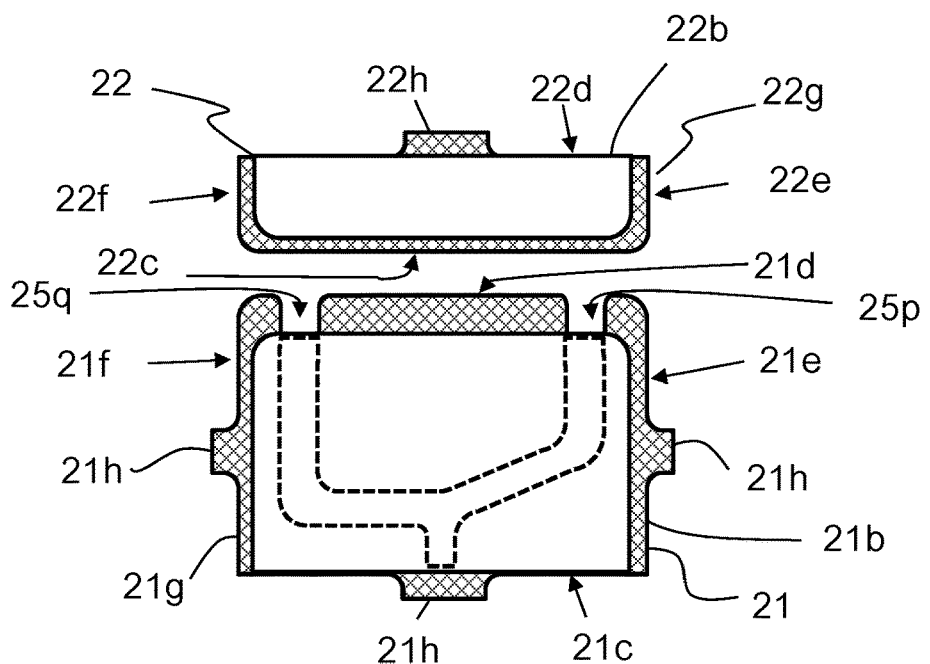
FIG. 10B is a schematic bottom view of the first lead and the second lead of the light emitting device of the second embodiment.

A light emitting device 102 is described which is the second embodiment of the present disclosure. FIG. 9A is a schematic top view of the light emitting device 102 in which the sealing member 75 and the light reflecting member 50 is not shown. FIG. 9B and FIG. 9C are schematic cross-sectional views of the light emitting device 102 taken along a line 9B-9B and line 9C-9C of FIG. 9A. FIG. 10A and FIG. 10B are a schematic top view and a schematic bottom view, respectively, of the first lead 21 and the second lead 22.

The light emitting device 102 is different from the light emitting device 101 of the first embodiment in that the first lead 21 does not have the notches 25m, 25n or the second grooves 21m, 21n, the resin body 30 does not include the first resin connecting portions 35m, 35n, the first lead instead has notches 25p, 25q and a third groove 21k, and the resin body 30 includes a second resin connecting portion 34. The other constituents of the light emitting device 102 are the same as those of the light emitting device 101, and therefore, the differences from the light emitting device 101 are mainly described.

The first lead 21 has the notches 25p, 25q provided at the lateral portion 21d that faces the second lead 22. The notch 25p, 25q is a hollow (i.e., hole) extending the first lead 21 from the upper surface 21a to the lower surface 21b, and has an opening (i.e., slit) at the outer edge of the lateral portion 21d. The notches 25p, 25p can be also referred to as recesses formed in the lateral portion 21d. The notches 25p, 25p do not need to be formed by cutting away parts of the lateral portion 21d. For example, the lateral portion 21d and the notches 25p, 25p may be integrally processed by etching or pressing.

The notches 25p, 25q are formed in the lateral edge groove 21g. The notches 25p, 25q may be entirely formed in the lateral edge groove 21g or a portion of the notches 25p, 25q may be partially located between the center the first lead 21 and the lateral edge groove 21g. The notches 25p, 25q may be in a region other than the lateral edge groove 21g of the first lead 21. The notches 25p, 25q are filled with a part of the third resin portion 33 of the resin body 30 or with a part of the second resin portion 32. The notches 25p, 25q may be formed at any position in the lateral portion 21d. In the present embodiment, the notches 25p, 25q are joined with both end portions of the first groove 21j provided in the upper surface 21a of the first lead 21.

The first lead 21 has a third groove 21k in the upper surface 21a. The third groove 21k is joined with the first groove 21j. In the present embodiment, the third groove 21k is joined with a portion of the first groove 21j near the middle of the first groove 21j in the longitudinal direction. In the case where the first groove 21j has a bent portion as shown in FIG. 10A, it is preferable that the third groove 21k is joined with the first groove 21j at the bent portion. With the third groove 21k joined with the first groove 21j near the bent portion, the possibility of insufficient filling or lack of the resin material can be reduced, in a portion at which the flow of the resin material is changed and accordingly insufficient filling with the resin material is likely to occur. Thus, the second portion 32d of the second resin portion 32 provided in the first groove 21j can be securely formed. The other end of the third groove 21k is joined with the first resin portion 31.

The resin body 30 includes a second resin connecting portion 34. The second resin connecting portion 34 is part of the resin body 30 between the second resin portion 32 and the first resin portion 31. The second resin connecting portion 34 connects the second resin portion 32 with the first resin portion 31. In the present embodiment, the second resin connecting portion 34 is disposed in the third groove 21k of the first lead 21. The second resin connecting portion 34 is joined with the second resin portion 32 and with a part of the inner wall surface 31c of the first resin portion 31 at a border with the bottom surface 11b. More specifically, one end portion of the second resin connecting portion 34 is joined with the second portion 32d of the second resin portion 32. The other end portion of the second resin connecting portion 34 is in contact with the inner wall surface 31c of the first resin portion 31 and is joined with a part of the first resin portion 31 between the lower surface 21b of the first lead 21 and the lower edge of the inner wall surface 31c. As shown in FIG. 9B, in the present embodiment, the second resin connecting portion 34 does not protrude from the upper surface 21a of the first lead 21, and the upper surface 34a of the second resin connecting portion 34 and the upper surface 21a of the first lead 21 are at substantially the same height. With this arrangement, when an uncured resin material for the light reflecting member 50 is ejected onto the bottom surface 11*b* of the recess 11, the uncured resin material can flow over the bottom surface 11*b* without being interrupted by the second resin connecting portion 34. The second resin connecting portion 34 may protrude from the upper surface 21*a* of the first lead 21. For example, in the case where the upper surface 21*a* of the first lead 21 does not have the third groove 21*k*, the second resin connecting portion 34 extends above the upper surface 21*a* of the first lead 21. When the second resin connecting portion 34 protrudes from the upper surface 21*a* of the first lead 21, it is preferable that the height of the second resin connecting portion 34 is smaller than the height of the second resin portion 32. In this case, the uncured resin material of the light reflecting member 50 can spread over the bottom surface 11*b* without interruption of the flow of the uncured resin material.

The third resin portion 33 of the resin body 30 is located also in the notches 25*p*, 25*q* of the first lead 21. The first portion 32*c* of the second resin portion 32 is disposed on the third resin portion 33 at portions in the notches 25*p*, 25*q*. In the present embodiment, as shown in FIG. 9A, the first portion 32*c* of the second resin portion 32 is disposed on the second portion 32*d*, which is in the first groove 21*j*, or on the third resin portion 33.

In the second resin portion 32, the second portion 32*d* of the second resin portion 32 is connected with the first resin portion 31 by the second resin connecting portion 34 at the bottom surface 11*b* of the recess 11. A part of the first portion 32*c* of the second resin portion 32 is located on the upper surface 33*a* of the third resin portion 33 and is joined with the third resin portion 33. Particularly in the present embodiment, the notches 25*p*, 25*q* are provided in a lateral portion of the first lead 21 which faces the second lead 22, and a part of the third resin portion 33 is disposed also in the notches 25*p*, 25*q*. Therefore, the contact area between the first portion 32*c* of the second resin portion 32 and the third resin portion 33 is greater than that in the light emitting device 101 of the first embodiment. Thus, the second resin portion 32 is prevented from separating and detached from the resin package 10. Thus, it is possible to more securely dispose the second resin portion 32 on the bottom surface 11*b*.

When the resin package 10 is formed by molding, the notches 25*p*, 25*q* and the third groove 21*k* function as the paths to a hollow of the mold which is for formation of the second resin portion 32. Therefore, when the resin package 10 is formed by molding with the use of a mold, the second resin portion 32 can be simultaneously formed. In the present embodiment, the third groove 21*k* is joined with the first groove 21*j* substantially at a middle between the opposite ends. Therefore, in the position at which the third groove 21*k* is joined, flow of the uncured resin material through the first groove 21*j* and a hollow of the mold corresponding to the second resin portion 32 are branched in two directions. Thus, the uncured resin material can be substantially uniformly supplied in a short time period.

Third Embodiment

Figure 11A:
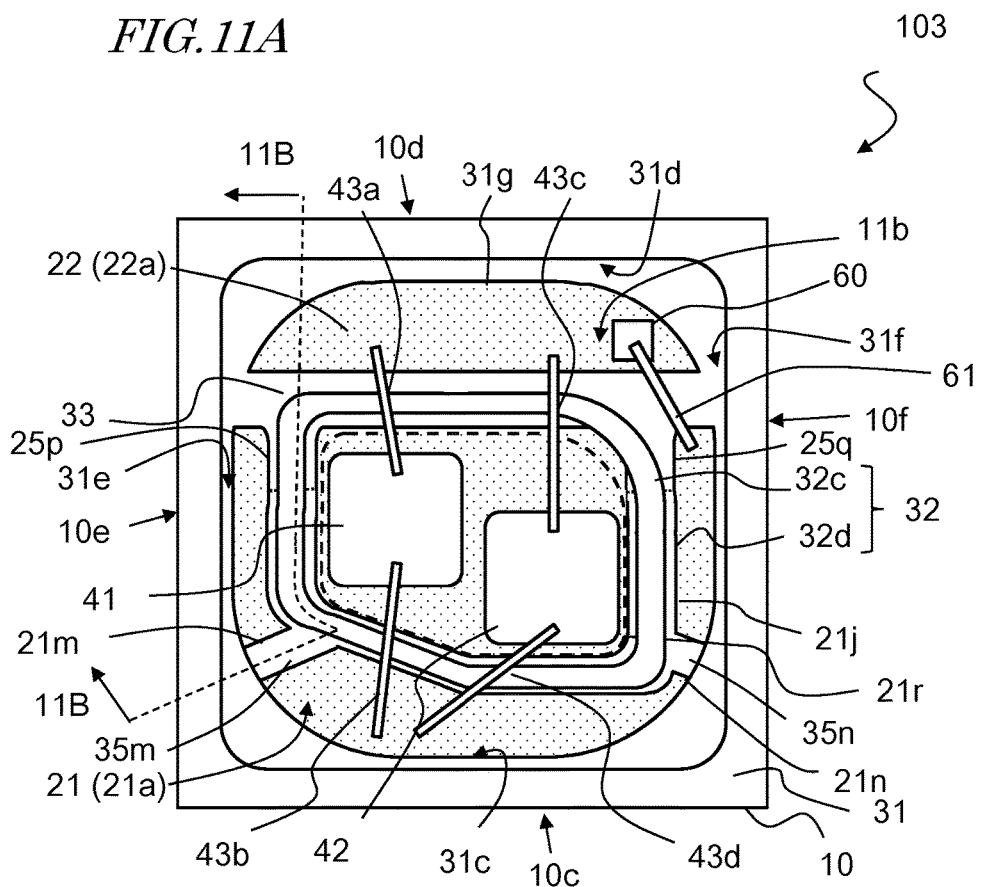
FIG. 11A is a schematic top view of a light emitting device of the third embodiment in which a light reflecting member is not shown.
Figure 11B:
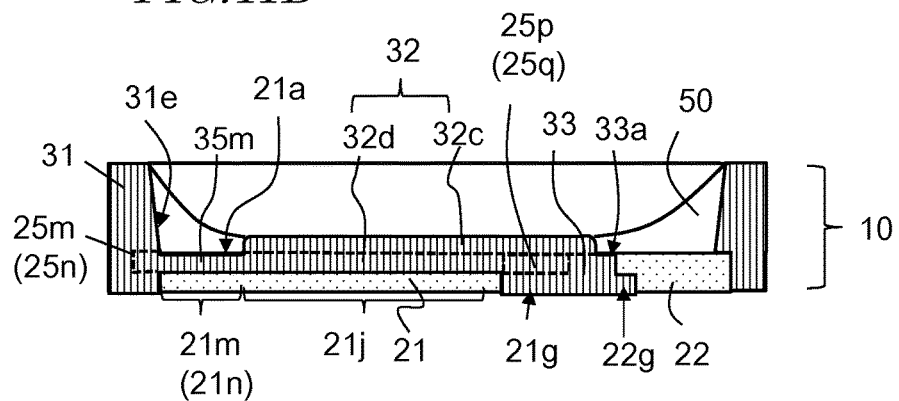
FIG. 11B is a schematic cross-sectional view of the light emitting device taken along a line 11B-11B of FIG. 11A.
Figure 12A:
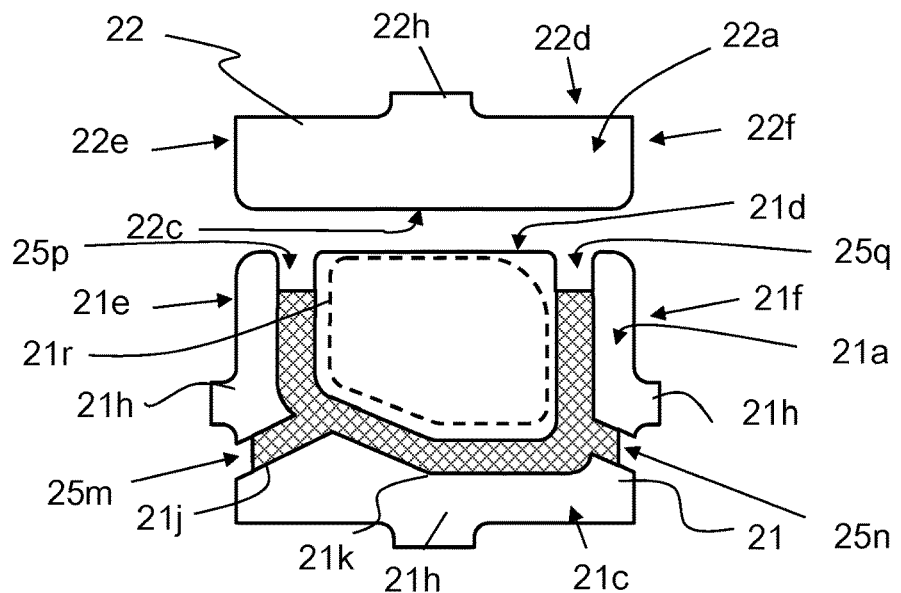
FIG. 12A is a schematic top view of a first lead and a second lead of the light emitting device of the third embodiment.
Figure 12B:
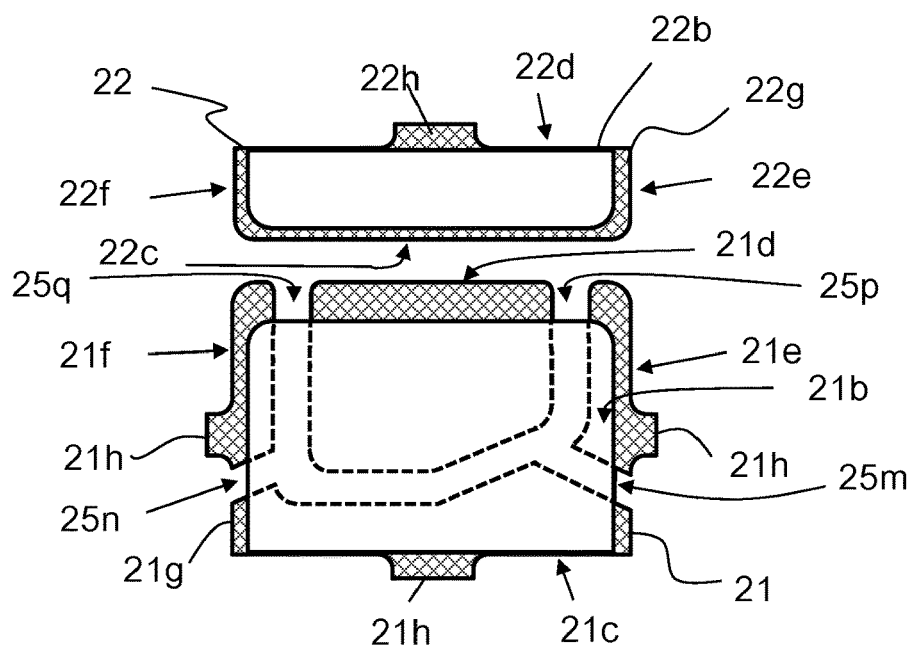
FIG. 12B is a schematic bottom view of the first lead and the second lead of the light emitting device of the third embodiment.

A light emitting device 103 is described which is the third embodiment of the present disclosure. FIG. 11A is a schematic top view of the light emitting device 103 in which the sealing member 75 and the light reflecting member 50 are not shown. FIG. 11B is a schematic cross-sectional view of the light emitting device 103 taken along a line 11B-11B of FIG. 11A. FIG. 12A and FIG. 12B are a schematic top view and a schematic bottom view, respectively, of the first lead 21 and the second lead 22. In FIG. 11B, the positions of the sealing member 75 and the light reflecting member 50 are designated by solid lines.

The light emitting device 103 is different from the light emitting device 101 of the first embodiment in that the first lead further has notches 25*p*, 25*q*. The other configurations of the light emitting device 103 are the same as those of the light emitting device 101, and therefore, the differences from the light emitting device 101 will be mainly described.

The first lead 21 has the notches 25*p*, 25*q* formed in the lateral portion 21*d* that faces the second lead 22. The notches 25*p*, 25*q* have, for example, the same configuration as that of the notches 25*p*, 25*q* provided in the light emitting device 102 of the second embodiment. Also, the notches 25*p*, 25*q* of the present embodiment are filled with part of the third resin portion 33, as in the the second embodiment.

In the light emitting device 103, the second resin portion 32 can be prevented from separating and detaching from the bottom surface 11*b* of the recess 11 as in the light emitting device 101 of the first embodiment. The notches 25*p*, 25*q* function as paths to a hollow for formation of the second resin portion 32, so that the hollows in the mold can be more securely filled with the uncured resin material can be further assured, and insufficient filling with the uncured resin material can be further prevented.

Fourth Embodiment

Figure 13:
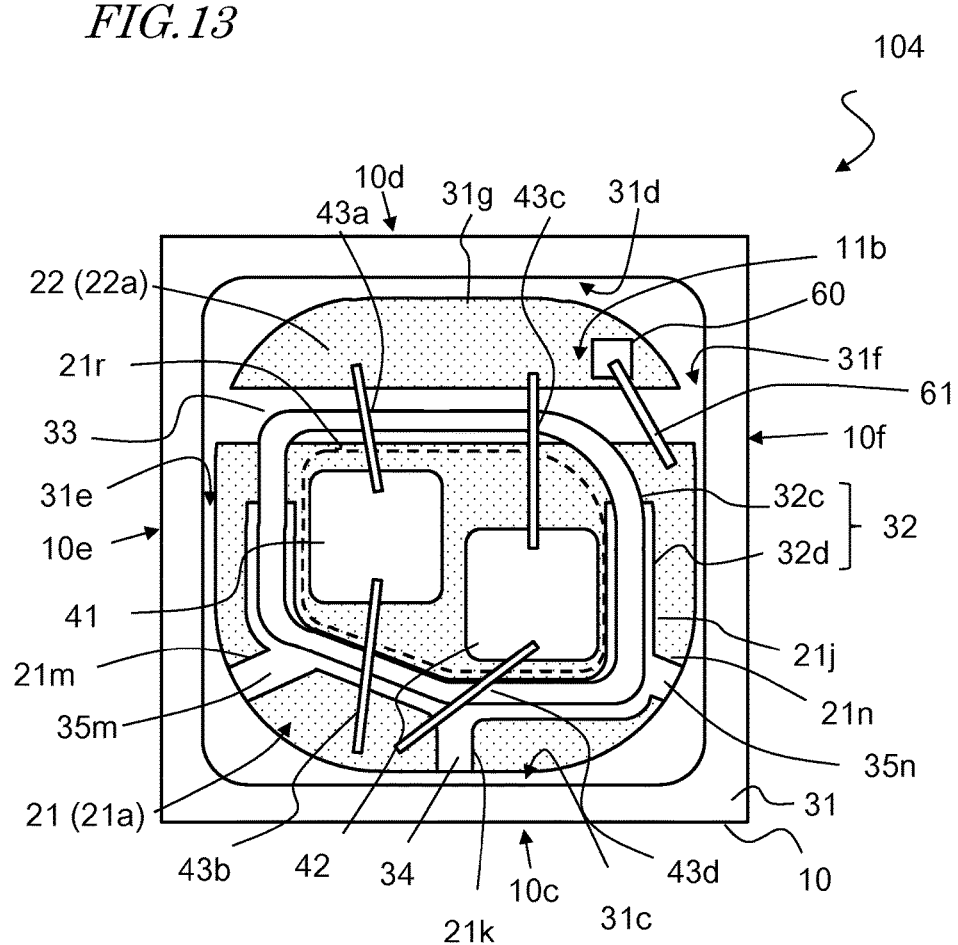
FIG. 13 is a schematic top view of a light emitting device of the fourth embodiment in which a light reflecting member is not shown.
Figure 14A:
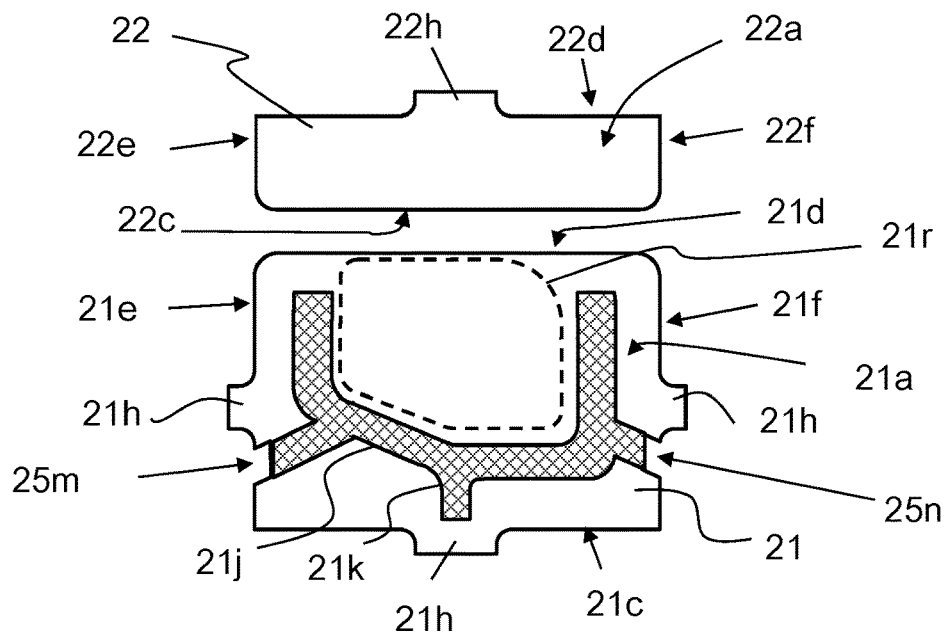
FIG. 14A is a schematic top view of a first lead and a second lead of the light emitting device of a fourth embodiment.
Figure 14B:
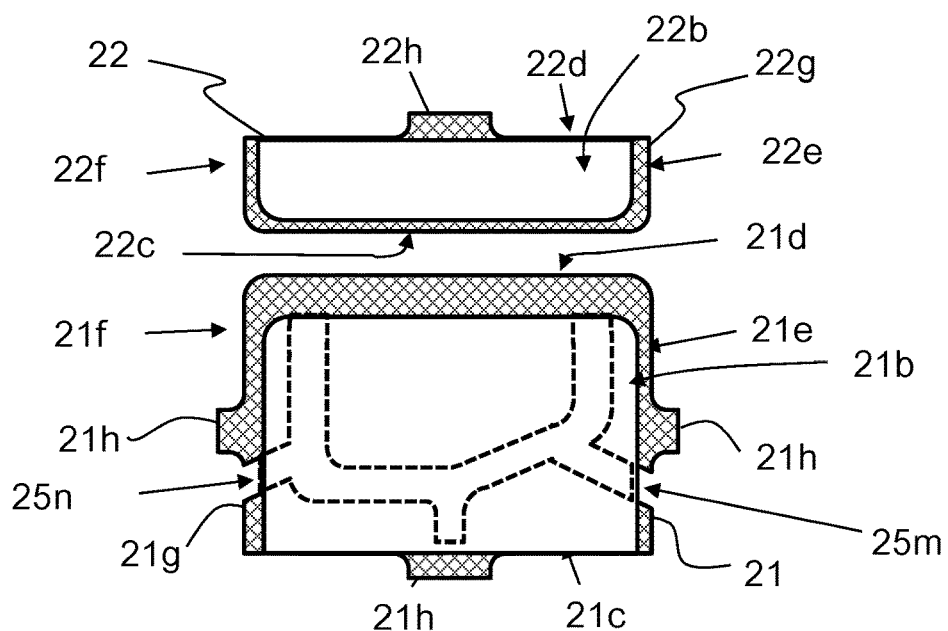
FIG. 14B is a schematic bottom view of the first lead and the second lead of the light emitting device of the fourth embodiment.

A light emitting device 104 is described which is the fourth embodiment of the present disclosure. FIG. 13 is a schematic top view of the light emitting device 104 in which the sealing member 75 and the light reflecting member 50 are not shown. FIG. 14A and FIG. 14B are a schematic top view and a schematic bottom view, respectively, of the first lead 21 and the second lead 22.

The light emitting device 104 is different from the light emitting device 101 of the first embodiment in that a third groove 21*k* is formed in the first lead 21 and that the resin body 30 includes a second resin connecting portion 34. The other constituents of the light emitting device 104 are the same as those of the light emitting device 101.

As in the second embodiment, the second resin connecting portion 34 is disposed in the third groove 21*k* of the first lead, and the second resin connecting portion 34 connects the second resin portion 32 with the first resin portion 31. According to the light emitting device 104, the second resin portion 32 can be prevented from separating and detaching from the bottom surface 11*b* of the recess 11 as in the light emitting device 101 of the first embodiment. With the second resin connecting portion 34 connecting the second resin portion 32 with the first resin portion 31, the second resin portion 32 can be further prevented from separating and detaching from the bottom surface 11*b* of the recess 11. Further, the third groove 21*k* functions as paths to a hollow for formation of the second resin portion 32, so that the hollows in the mold can be more securely filled with the uncured resin material, and thus insufficient filling with the uncured resin material can be further prevented.

Fifth Embodiment

Figure 15A:
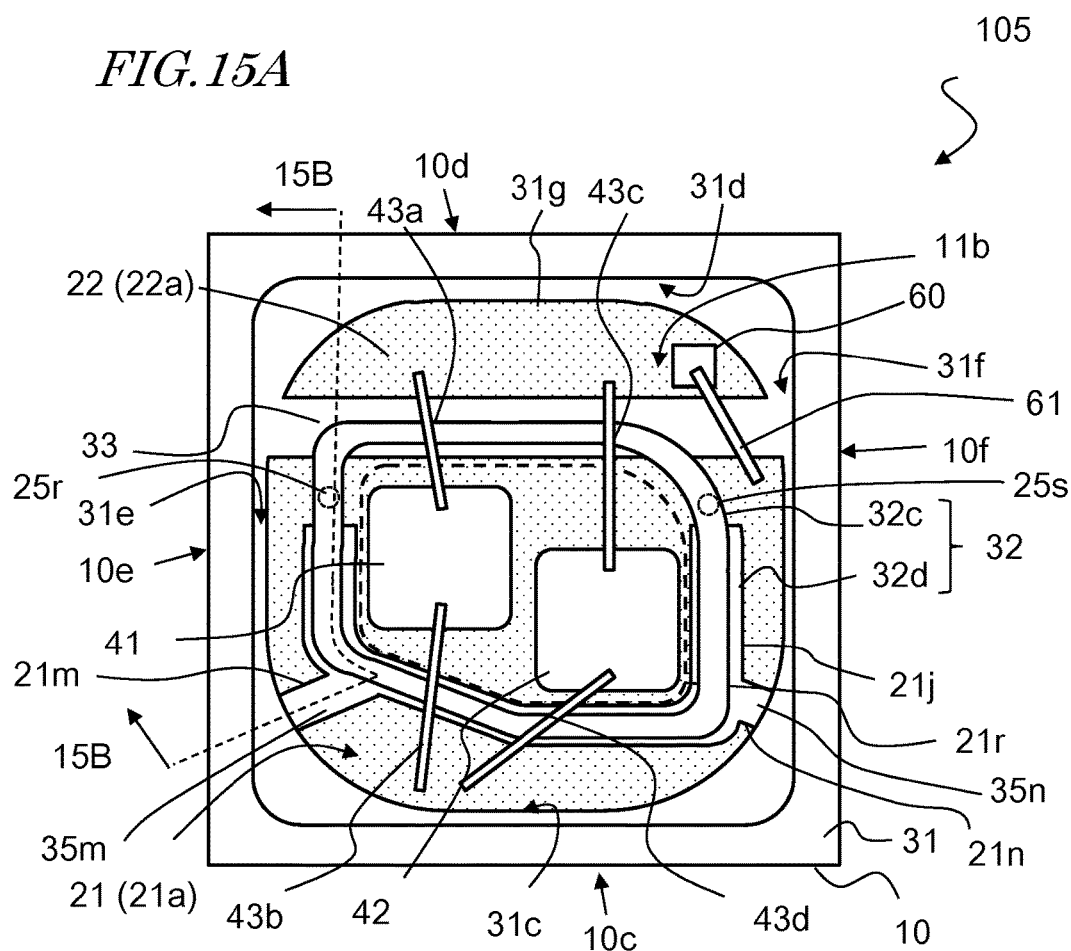
FIG. 15A is a schematic top view of a light emitting device of a fifth embodiment in which a light reflecting member is not shown.
Figure 15B:
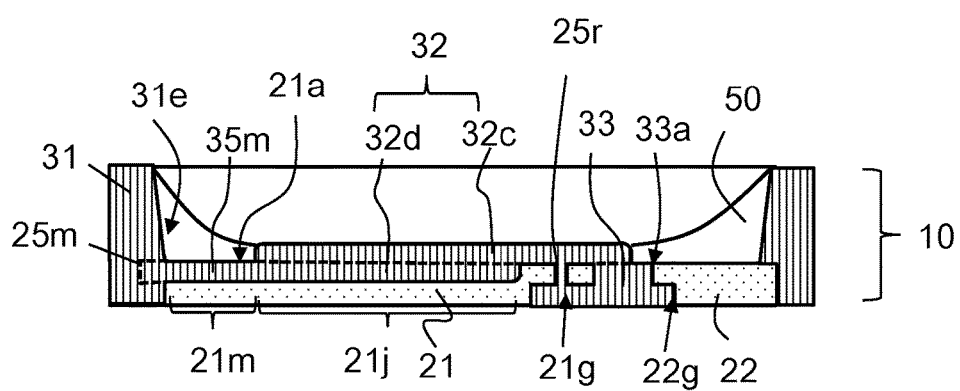
FIG. 15B is a schematic cross-sectional view of the light emitting device taken along a line 15B-15B of FIG. 15A.
Figure 16A:
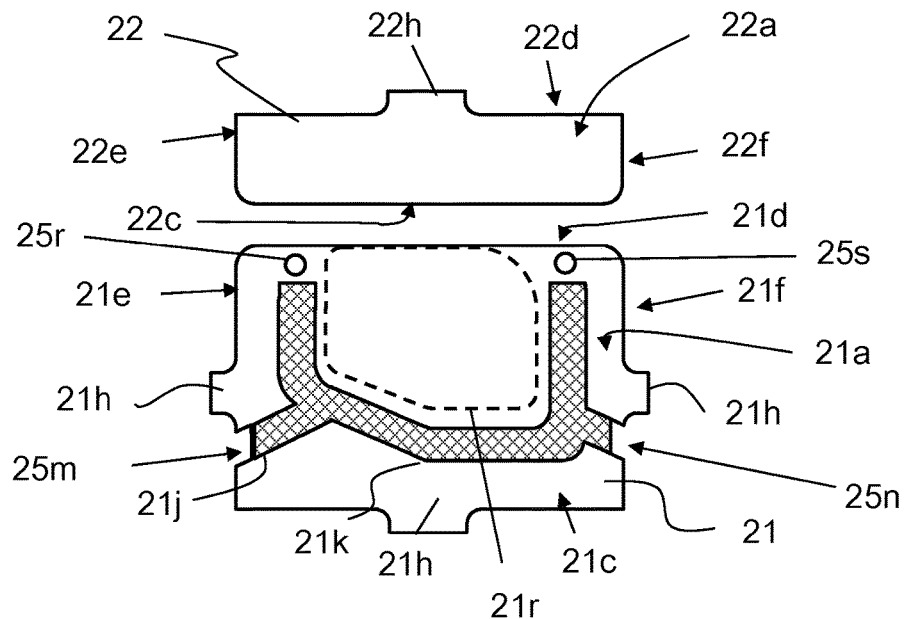
FIG. 16A is a schematic top view of a first lead and a second lead of the light emitting device of the fifth embodiment.
Figure 16B:
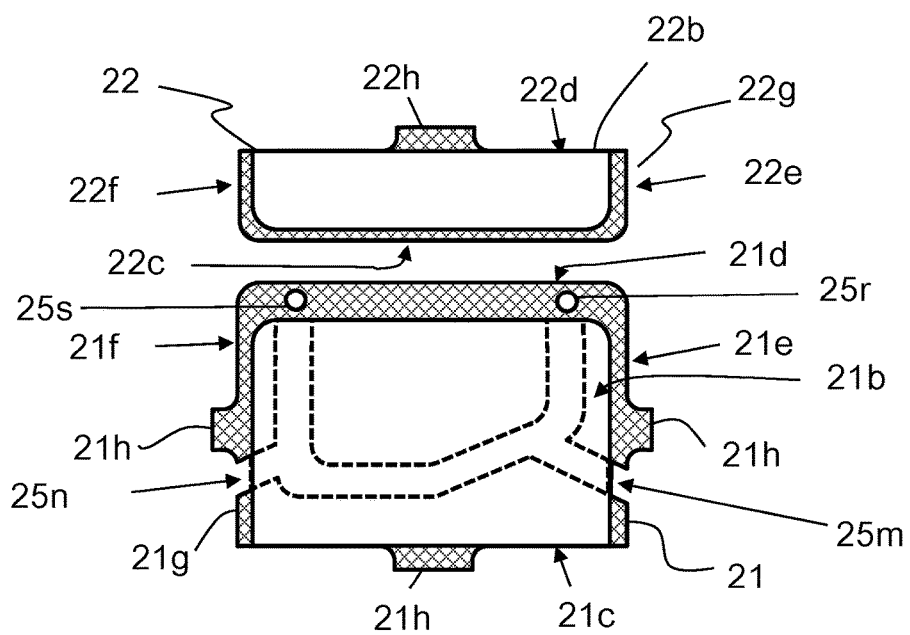
FIG. 16B is a schematic bottom view of the first lead and the second lead of the light emitting device of the fifth embodiment.

A light emitting device 105 is described which is the fifth embodiment of the present disclosure. FIG. 15A is a schematic top view of the light emitting device 105 in which the sealing member 75 and the light reflecting member 50 are not shown. FIG. 15B is a schematic cross-sectional view of the light emitting device 105 taken along a line 15B-15B of FIG. 15A. FIG. 16A and FIG. 16B are a schematic top view and a schematic bottom view, respectively, of the first lead 21 and the second lead 22. In FIG. 15B, the positions of the sealing member 75 and the light reflecting member 50 are designated by solid lines.

The light emitting device 105 is different from the light emitting device 101 of the first embodiment in that the first lead 21 further has notches 25r, 25s. The other configurations of the light emitting device 105 are the same as those of the light emitting device 101, and therefore, the differences from the light emitting device 101 are mainly described.

The first lead 21 has the notches 25r, 25s formed in the lateral portion 21d that faces the second lead 22. The notches 25r, 25s are holes extending through the first lead 21 from the upper surface 21a to the lower surface 21b and are spaced away from the outer edge of the lateral portion 21d. Thus, in a plan view, the contours of the notches 25r, 25s are not open (i.e., do not have slits), and are closed. The notches 25r, 25s may be formed by using a boring method, such as laser processing. Alternatively, the lateral portion 21d and the notches 25r, 25s may be integrally formed by, for example, etching or pressing.

The notches 25r, 25s are provided in the lateral edge groove 21g. An entirety of the notches 25r, 25s may be provided in the lateral edge groove 21g, or a portion of each of the notches 25r, 25s may be located between the center of the first lead 21 and the lateral edge groove 21g. The notches 25r, 25s may be disposed in a region other than the lateral edge groove 21g of the first lead 21 irrespective of whether or not the lateral edge groove 21g is formed.

At least a part of each of the notches 25r, 25s overlaps the second resin portion 32 in a plan view. More specifically, the notches 25r, 25s of the first lead 21 are disposed below the first portion 32c of the second resin portion 32. With the lateral edge groove 21g filled with part of the third resin portion 33, at least a part of the notches 25r, 25s is located between the second resin portion 32 and the third resin portion 33 in the thickness direction of the first lead 21. In the notches 25r, 25s, a part of the second resin portion 32 and/or a part of the third resin portion 33 is provided.

The first portion 32c of the second resin portion 32 is connected with the third resin portion 33 via the second resin portion 32 or the third resin portion 33 in the notches 25r, 25s. Therefore, the first portion 32c of the second resin portion 32 can be prevented from separating and detaching from the bottom surface 11b of the recess 11.

The notches 25r, 25s function as the paths for formation of the second resin portion 32, so that the hollows in the mold can be more securely filled with the uncured resin material, and insufficient filling with the uncured resin material can be further prevented. Further, the adhesion between the third resin portion 33 and the first lead 21 can be improved.

The notches 25m, 25n may be replaced by holes spaced away from the outer edge of the lateral portion 21e, 21f, as in the notches 25r, 25s.

Sixth Embodiment

Figure 17A:
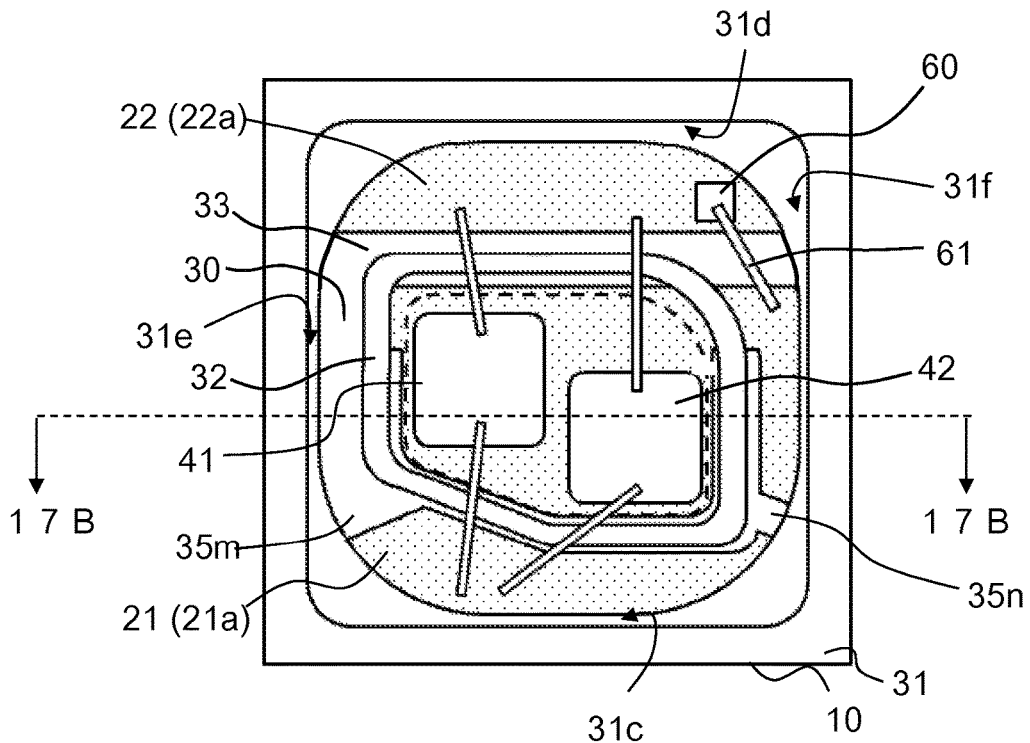
FIG. 17A is a schematic top view of a light emitting device of a sixth embodiment in which a sealing member and a light reflecting member are not shown.
Figure 17B:
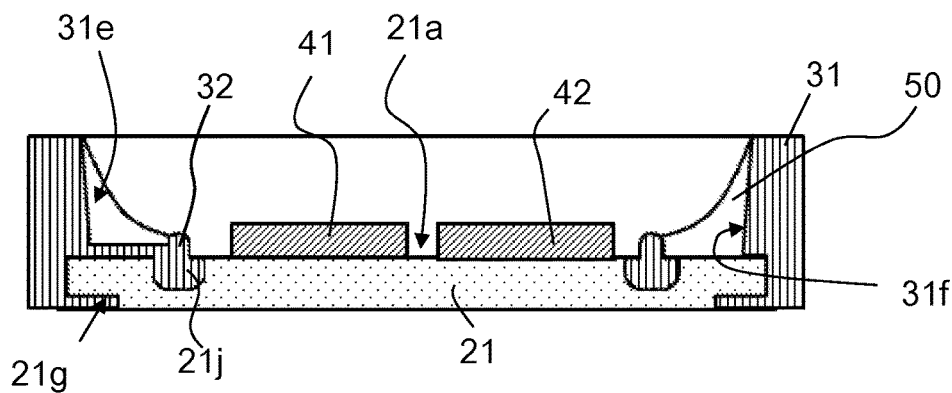
FIG. 17B is a schematic cross-sectional view of the light emitting device taken along a line 17B-17B of FIG. 17A.
Figure 18A:
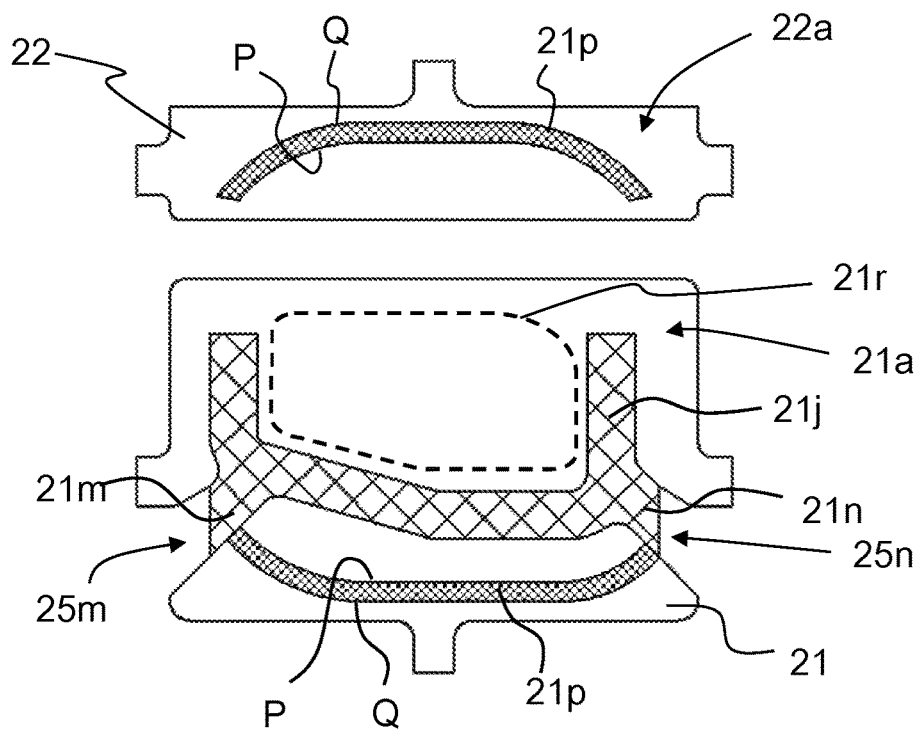
FIG. 18A is a schematic top view of the first lead and the second lead of the light emitting device of the sixth embodiment.

A light emitting device 106 is described which is the sixth embodiment of the present disclosure. FIG. 17A is a schematic top view of the light emitting device 106 in which the sealing member 75 and the light reflecting member 50 are not shown. FIG. 17B is a schematic cross-sectional view of the light emitting device taken along a line 17B-17B of FIG. 17A. FIG. 18A is a schematic top view of the first lead 21 and the second lead 22. In FIG. 17B, the positions of the sealing member 75 and the light reflecting member 50 are designated by solid lines.

The light emitting device 106 is different from the light emitting device 101 of the first embodiment in that a portion of the upper surface of the first lead 21 between the inner wall surface 31e of the resin package 10 and the second resin portion 32 is covered with the resin body 30, and that a fourth groove 21p is further formed in the upper surface of the first lead 21 and the second lead 22. Other configurations of the light emitting device 106 are the same as those of the light emitting device 101, and therefore, the differences from the light emitting device 101 are mainly described.

In the light emitting device 106, a portion of the upper surface of the first lead 21 between the inner wall surface of the resin package 10 and the second resin portion 32 is covered with part of the resin body 30. In the light emitting device 106 shown in FIG. 17A, the resin body 30 covers a portion of the upper surface of the first lead 21 in a region surrounded by the inner wall surface 31e of the resin package 10, the second resin portion 32, the third resin portion 33 and the first resin connecting portion 35m, in a plan view. A part of the resin body 30 connects the inner wall surface with the second resin portion 32, so that the possibility that the second resin portion 32 is separated from the first lead 21 can be reduced. Further, a resin material to be the resin body 30 is more likely to be flown into the second resin portion 32, so that lack of a portion of the second resin portion 32 can be further prevented.

At the time of forming the resin body 30 with the use of a mold, in the case where the distance between a portion which is to be the inner wall surface and a portion which is to be the second resin portion 32 is reduced, a protrusion of the upper mold which is to be inserted into this region needs to have a tapered edge for insertion. In the case where the protrusion of the upper mold has a tapered edge, a mold-separation sheet which protects the surface of the upper mold may be broken by the tapered portion, and the surface of the upper die may become dirty. In view of this, in a region where the distance between the portion which is to be the inner wall surface and the portion which is to be the second resin portion 32 is shorter, the protrusion of the upper mold has a height such that the protrusion does not come into contact with the upper surface of the lead when the lead is attached to the upper mold, and the taper of the edge is reduced as much as possible. Such arrangements are advantageous in view of preventing breakage of the mold-separation sheet. The resin material flows into a region of the upper surface of the lead with which the protrusion of the upper mold is not in contact when the lead is attached to the upper mold, so that a part of the resin body 30 covers that region and connects the inner wall surface with the second resin portion 32. The expression "the case where the distance between the portion which is to be the inner wall surface and the portion which is to be the second resin portion 32 is reduced" refers to the case where, for example, distance is about 3 to 5 times the thickness of the mold separation sheet. In the case of using the mold separation sheet having a thickness of 30 to 40 µm, the expression "the case where the distance between the portion which is to be the inner wall surface and the portion which is to be the second resin portion 32 is reduced" refers to the case where a distance between the portion which is to be the inner wall surface and the portion which is to be the second resin portion 32 is about 90 to 200 µm. A relative ratio of the shortest distance between the portion which is to be the inner wall surface and the portion which is to be the second resin portion 32 to the longest distance therebetween is, for example, in a range of 0.5 to 0.8.

A portion of the resin body 30 between the inner wall surface 31e and the second resin portion 32 is located at a position higher than the height of the upper surface 21a of the first lead 21 and lower than the height of the second resin portion 32 as shown in FIG. 17B. With the resin body 30 having a portion between the inner wall surface and the second resin portion 32 located at a position lower than the height of the second resin portion 32, a resin material injected for formation of the light reflecting member 50 can be surely dammed by the second resin portion 32. This arrangement can prevent the light reflecting member 50 from covering the lateral surfaces of the light emitting elements 41, 42. In the light emitting device 106 shown in FIG. 17A and FIG. 17B, a part of the resin body 30 is located between the inner wall surface 31e and the second resin portion 32, but a part of the resin body 30 may be located between the other inner wall surfaces 31c, 31d, 31f and the second resin portion 32. A part of the resin body 30 is preferably located in a region where the distance between the inner wall surface and the second resin portion 32 is reduced, but a part of the resin body 30 may be located in a region where that distance is increased. This allows the resin material to be more likely to flow into the second resin portion 32, so that lack of a portion of the second resin portion 32 can be prevented.

The light emitting device 106 includes fourth grooves 21p, each of which is formed in the upper surface of the first lead 21 and the second lead 22 as shown in FIG. 18A. Each of the fourth grooves 21p is formed in the upper surface of the first lead 21 and/or the second lead 22 so as to extend along at least a part of the inner wall surface. As shown in FIG. 18A, each fourth groove 21p is provided in each of the upper surface 21a of the first lead 21 and the upper surface 22a of the second lead 22. Each fourth groove 21p is formed along a part of the inner wall surface 31c and a part of the inner wall surface 31d. In each of the fourth grooves 21p, a part of the resin body 30 is disposed. This allows for improving the adhesion between the first lead 21 and the second lead 22 and the resin body 30.

Each of the fourth grooves 21p includes an inner upper edge P and an outer upper edge Q. The inner upper edge P is one of the upper edges of each of the fourth grooves 21p at a side closer to the element mounting region 21r. The outer upper edge Q is one of the upper edges of each of the fourth grooves 21p at a side farther from the element mounting region 21r. In the case of forming the resin body 30 with the use of a mold, it is preferable that the protrusion of the upper mold overlaps the inner upper edge P in a plan view, and an end portion of the protrusion of the upper mold is located between the inner upper edge P and the outer upper edge Q. With the protrusion of the upper die arranged so as to overlap the inner upper edge P, the protrusion of the upper mold is attached to a portion of the lead in the vicinity of the inner upper edge P, so that the resin body 30 is not formed in the vicinity of the inner upper edge P. Meanwhile, with an end portion of the protrusion of the upper mold arranged between the inner upper edge P and the outer upper edge Q, a part of the resin body 30 can be disposed in the fourth groove 21p, so that the outer upper edge Q is buried in the resin body 30. Thus, after formation of the resin body 30, the inner upper edge P is located at an edge portion of the bottom surface 11b of the recess 11 and is exposed from the resin body 30, while the outer upper edge Q is buried in the resin body 30.

With the protrusion of the upper mold arranged as described above, at the time of forming the resin body 30 with the use of a mold, the resin body 30 can be prevented from being formed in the vicinity of the inside upper edge P, and a part of the resin body 30 can be prevented from being formed as a resin burr at an edge portion of the bottom surface 11b of the recess 11. Further, with the resin body 30 including portions disposed in the fourth grooves 21p, the adhesion between the first lead 21 and the resin body 30 and the adhesion between the second lead 22 and the resin body 30 can be improved.

Figure 18B:
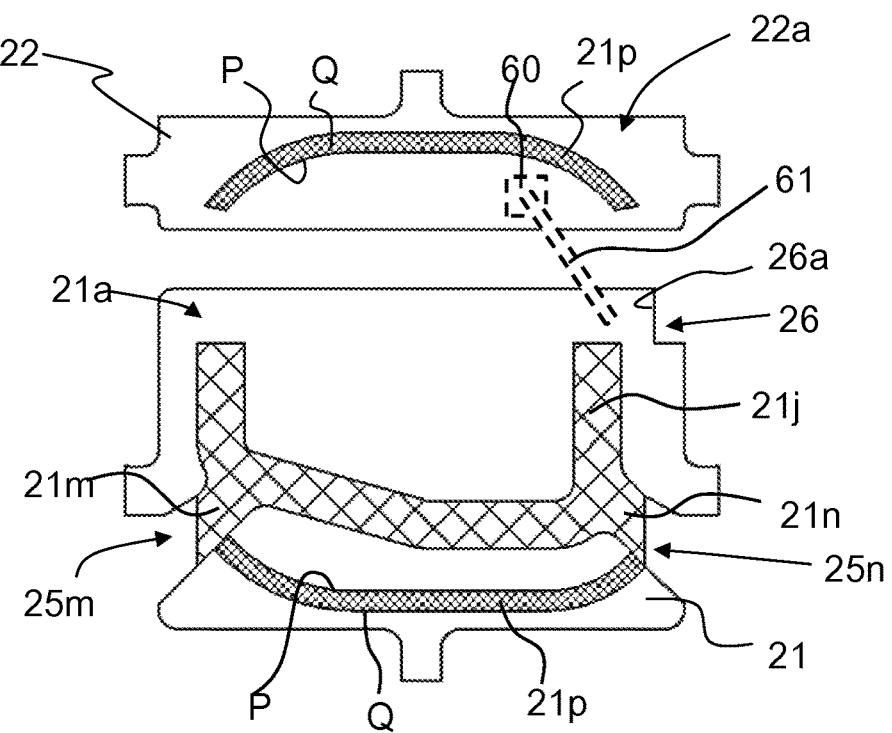
FIG. 18B is a schematic top view of the first lead and the second lead of the light emitting device of the sixth embodiment.

The fourth groove 21p in the first lead 21 is preferably in communication with a part of the first groove 21j and/or a part of the second grooves 21m, 21n. In FIG. 18B, the fourth groove 21p in the first lead 21 is in communication with both the second groove 21m and the second groove 21n. With this arrangement, a part of the resin material flowing into the fourth groove 21p in the first lead 21 also flows into the first groove 21j and the second grooves 21m, 21n, so that the possibility of partial lack of the second resin portion 32 can be decreased. When the light emitting device 106 further includes a third groove 21k such as shown in FIG. 10A, the third groove 21k may be in communication with the fourth groove 21p in the first lead 21.

Meanwhile, a part of the resin material flowing into the first groove 21j and the second grooves 21m, 21n also flows into the fourth groove 21p. However, in view of preventing lack in a portion of the second resin portion 32, it is preferable that the resin material in the first groove 21j and the second grooves 21m, 21n is unlikely to flow into the fourth groove 21p. For example, the depth of the first groove 21j and the second grooves 21m, 21n is greater than the depth of the fourth groove 21p. This allows for forming a step portion in the vicinity of a connecting portion between the first groove 21j or the second grooves 21m, 21n and the fourth groove 21p such that the fourth groove 21p is located at a higher position. With this step portion, the resin material flowing into the first groove 21j and the second grooves 21m, 21n is unlikely to flow into the fourth groove 21p. Accordingly, the first groove 21j and the second grooves 21m, 21n are more easily filled with the resin material, so that lack of the second resin portion 32 can be prevented.

FIG. 18B is a schematic top view showing another form of the first lead 21 and the second lead 22 of the light emitting device 106. In FIG. 18B, the first lead 21 has a hole 26 at a corner thereof. Specifically, the first lead 21 has the hole 26 near a region where the wire 61 of the protection element 60 is connected. Forming the hole 26 at such a position and allowing an edge 26a of the hole 26 to be attached with the protrusion of the upper mold of the mold allows for preventing a part of the resin body 30 to be a resin burr near the hole 26. As a result, the possibility of poor connection of the wire 61 of the protection element 60 due to a resin burr can be reduced.

Other Embodiments

Various modifications can be made to the light emitting devices. For example, the notches 25m, 25n, 25p, 25q, 25r, 25s are not limited to have a rectangular or circular shape but may have any other shape. For example, the notches 25m, 25n, 25p, 25q, 25r, 25s may have the shape of a triangle or a polygon which has five or more angles, or may have an oval shape. The light emitting device may have a single notch 25m, 25n, 25p, 25q, 25r, 25s or may have three or more notches 25m, 25n, 25p, 25q, 25r, 25s. Any of the notches 25m, 25n, 25p, 25q, 25r, 25s may be provided in the lateral portion 21c of the first lead 21 or may be provided in the second lead 22.

As described above, the resin package of the light emitting device may include three or more leads. In this case, the above-described notches may be provided in any of the leads. The light emitting device may include a single light emitting element or may include three or more light emitting elements.

While exemplary embodiments of the present invention have been described, it will be apparent to those skilled in the art that the disclosed invention may be modified in numerous ways and may assume many embodiments other than those specifically described above. Accordingly, it is intended for the appended claims to cover all modifications of the invention that fall within the true spirit and scope of the invention.

What is claimed is:

1. A light emitting device comprising:
    a resin package comprising:
        a plurality of leads including:
            a first lead comprising:
                at least one notch extending from an upper surface of the first lead to a lower surface of the first lead,
                a first groove formed in the upper surface of the first lead in at least a part of a region surrounding an element mounting region, and
                at least one second groove connecting the first groove with the at least one notch, and
            a second lead, and
        a resin body comprising:
            a first resin portion forming an outer lateral surface of the resin package,
            a second resin portion surrounding an element mounting region, a part of the second resin portion being disposed in the first groove,
            a third resin portion disposed between the first lead and the second lead, and
            a first resin connecting portion connecting the first resin portion with the second resin portion, at least a part of the first resin connecting portion being disposed in the at least one second groove,
        wherein the plurality of leads and an inner wall surface of the first resin portion form a recess,
        wherein a part of the upper surface of the first lead, a part of an upper surface of the second lead, and a part of an upper surface of the third resin portion are disposed at a bottom of the recess,
        wherein the at least one notch of the first lead is disposed inside the first resin portion;
    a light emitting element disposed on the element mounting region; and
    a light reflecting member disposed in the recess at a location between the inner wall surface and the second resin portion.

2. The light emitting device according to claim 1 wherein:
    in a plan view, the first lead has a substantially rectangular shape, and the at least one notch includes a first notch and a second notch respectively disposed at a lateral portion of two respective opposite sides of the rectangular shape that do not face the second lead.

3. The light emitting device according to claim 1, wherein the notch has an opening at an outer edge of the first lead in a plan view.

4. The light emitting device according to claim 1, wherein the notch is spaced away from an outer edge of the first lead in a plan view.

5. The light emitting device according to claim 1, wherein:
    the at least one notch comprises a plurality of notches, including a first notch that is spaced away from an outer edge of the first lead in a plan view, and a second notch that has an opening at an outer edge of the first lead in a plan view.

6. The light emitting device according to claim 1, wherein:
    the resin body further includes a second resin connecting portion,
    the first lead has a third groove that is in communication with the first groove,
    at least a part of the second resin connecting portion is located in the third groove, and
    the second resin connecting portion connects the first resin portion with the second resin portion.

7. The light emitting device according to claim 1, wherein:
    the first lead has a lateral edge groove in a lateral portion thereof, the lateral edge groove being recessed from the lower surface toward the upper surface side, and
    the notch is formed in the lateral edge groove.

8. The light emitting device according to claim 1, wherein:
    the light emitting device further comprises a sealing member that includes a first sealing portion and a second sealing portion in the recess,
    the first sealing portion is disposed on an upper surface of the light emitting element, and
    the second sealing portion covers an upper surface of the first sealing portion and a lateral surface of the light emitting element.

9. The light emitting device according to claim 1, wherein a fourth groove is formed in the upper surface of the first lead and/or an upper surface of the second lead, the fourth groove extending along at least a part of the inner wall surface.

10. The light emitting device according to claim 9, wherein the fourth groove is in communication with a part of the first groove and/or a part of the second groove.

11. A light emitting device, comprising:
    a resin package comprising:
        a plurality of leads including:
            a first lead comprising:
                a first notch extending from an upper surface of the first lead to a lower surface of the first lead, and
                a first groove formed in the upper surface of the first lead in at least a part of a region surrounding the element mounting region, and
            a second lead, and
        a resin body comprising:
            a first resin portion,
            a second resin portion surrounding an element mounting region, a first part of the second resin portion being disposed in the first groove, and
            a third resin portion disposed between the first lead and the second lead,
        wherein the plurality of leads and the first resin portion form a recess that has an inner wall surface,
        wherein a part of the upper surface of the first lead, a part of an upper surface of the second lead, and a part of an upper surface of the third resin portion are disposed at a bottom surface of the recess,
wherein at least a part of the first notch overlaps the second resin portion in a plan view;
a light emitting element disposed on the element mounting region; and
a light reflecting member disposed in the recess at a location between the inner wall surface and the second resin portion.

12. The light emitting device according to claim 11, wherein:
at least a part of the first notch is disposed between the second resin portion and the third resin portion, and
a second part of the second resin portion and/or a part of the third resin portion is disposed in the first notch.

13. The light emitting device according to claim 11 wherein:
in a plan view, the first lead has a substantially rectangular shape, and
the first notch is disposed at a lateral portion of a side of the rectangular shape that faces the second lead.

14. The light emitting device according to claim 11, wherein:
the resin body further comprises a first resin connecting portion,
the first lead further comprises a second notch, and a second groove that connects the first groove with the second notch,
at least a part of the first resin connecting portion is disposed in the second groove, and
the second notch of the first lead is disposed inside the first resin portion.

\* \* \* \* \*